United States Patent
Hayakawa et al.

(10) Patent No.: US 6,759,104 B2
(45) Date of Patent: Jul. 6, 2004

(54) PHOTOCURABLE COMPOSITION, CURED PRODUCT AND PROCESS FOR PRODUCING THE SAME

(75) Inventors: Seiichiro Hayakawa, Ibaraki (JP); Akihiko Sakai, Ibaraki (JP); Akira Esaki, Ibaraki (JP); Yutaka Tamura, Ibaraki (JP)

(73) Assignee: Mitsubishi Chemical Corporation, Tokyo (JP)

( * ) Notice: Subject to any disclaimer, the term of this patent is extended or adjusted under 35 U.S.C. 154(b) by 52 days.

(21) Appl. No.: 10/259,778

(22) Filed: Sep. 30, 2002

(65) Prior Publication Data

US 2003/0118941 A1 Jun. 26, 2003

Related U.S. Application Data

(63) Continuation of application No. PCT/JP01/02490, filed on Mar. 27, 2001.

(30) Foreign Application Priority Data

| Mar. 30, 2000 | (JP) | P.2000-094716 |
| Mar. 30, 2000 | (JP) | P.2000-094717 |
| Nov. 2, 2000 | (JP) | P.2000-336117 |
| Nov. 2, 2000 | (JP) | P.2000-336118 |

(51) Int. Cl.[7] .................. C09K 19/00; C08G 75/04; C08G 65/38
(52) U.S. Cl. .................. 428/1.6; 522/178; 522/180; 522/182; 522/173; 522/167; 528/306; 528/376; 528/128; 528/205; 528/212; 428/1.1
(58) Field of Search ................ 428/1.1, 1.6; 522/180, 522/182, 178, 173, 167; 528/128, 205, 212, 306, 376

(56) References Cited

U.S. PATENT DOCUMENTS

| 5,498,365 A | * | 3/1996 | Nolan et al. .............. 252/299.1 |
| 5,721,597 A | * | 2/1998 | Kakinuma et al. ............ 349/86 |
| 5,977,276 A | * | 11/1999 | Toh et al. .................... 526/308 |
| 6,075,065 A | | 6/2000 | Yamazaki et al. |
| 6,365,771 B1 | * | 4/2002 | Suzuki et al. ................ 560/220 |

FOREIGN PATENT DOCUMENTS

| JP | 6-1869 | 1/1994 |
| JP | 8-311125 | 11/1996 |
| JP | 9-152510 | 6/1997 |
| JP | 9-286809 | 11/1997 |
| JP | 10025621 | 1/1998 |
| JP | 10025624 | 1/1998 |
| JP | 10077321 | 3/1998 |
| JP | 10-231340 | 9/1998 |
| JP | 11-223702 | 8/1999 |
| WO | WO 00/15591 | 3/2000 |

OTHER PUBLICATIONS

EP 1275 668 A1 Jan. 15, 2003 Europe.

* cited by examiner

*Primary Examiner*—Susan Berman
(74) *Attorney, Agent, or Firm*—Oblon, Spivak, McClelland, Maier & Neustadt, P.C.

(57) ABSTRACT

A photocurable composition, wherein a small amount of an alicyclic skeleton-containing mono(meth) acrylate is incorporated in a combination of an alicyclic skeleton-containing bis(meth)acrylate and a mercapto compound, a cured product obtained by the copolymerization thereof, and a process for producing the cured product.

13 Claims, 2 Drawing Sheets

PHOTOCURABLE COMPOSITION, CURED PRODUCT AND PROCESS FOR PRODUCING THE SAME

This application is a Continuation International Application No. PCT/JP01/02490, filed Mar. 27, 2001.

TECHNICAL FIELD

The present invention relates to a photocurable composition, a cured product comprising same, and a process for the preparation thereof. More particularly, the present invention relates to a photocurable composition comprising a small amount of an alicyclic skeleton-containing mono(meth)acrylate (hereinafter occasionally abbreviated as "mono(meth)acrylate") incorporated in a combination of an alicyclic skeleton-containing bis(meth)acrylate (hereinafter occasionally abbreviated as "bis(meth)acrylate") and a mercapto compound, a cured product obtained by the copolymerization thereof, and a process for producing the same.

BACKGROUND ART

A liquid crystal display panel which has heretofore been used comprises a glass plate incorporated therein as a substrate. However, since such a panel is limited in the reduction of density of glass and the enhancement of mechanical strength of glass, the recent requirement for reduction of weight and thickness cannot be met. Further, problems with enhancement of productivity have been pointed out from the standpoint of formability and workability. Thus, a panel comprising plastic as a substrate has been noted.

However, a plastic substrate has many problems with low birefringence suitable for liquid crystal display, heat resistance, mechanical strength, water absorption, product yield, etc.

Referring to low birefringence, a glass plate has a birefringence $\Delta n \cdot d$ of not greater than 1 nm while a plastic substrate has a birefringence $\Delta n \cdot d$ of not smaller than a few nanometers. Referring to heat resistance, a glass plate can withstand a liquid crystal cell assembly step at a temperature of not lower than 200° C. while a plastic substrate is disadvantageous in that it undergoes deformation such as warpage due to insufficient heat resistance even if the assembly step is effected at a temperature as low as about 150° C. Referring to water absorption, which raises no problems with glass plate, a plastic substrate is disadvantageous in that it undergoes dimensional deformation or causes the cell to undergo inability for display due to hygroscopic deformation when washed with water during the formation of cell.

As a means for solving these problems, Japanese Patent Laid-Open No. 1997-152510, etc. propose a low birefringence substrate obtained by subjecting a composition comprising bis(meth)acrylate and a polyfunctional mercapto compound having two or more thiol groups per molecule to curing by photopolymerization. The low birefringence substrate has a birefringence as low as not greater than 1 nm and a heat resistance as high as not lower than 150° C. but has a deteriorated mechanical strength and hence a deterioration in flexibility and cracking resistance, which are inherent to plastic, due to the highly crosslinked high molecular structure. Accordingly, the sheet is damaged during the preparation of a plastic substrate having a thickness as relatively small as from about 0.05 mm to 3 mm or the plastic cell cracks during the falling of the display product, causing yield drop and hence adding to cost.

In order to improve the mechanical strength of the plastic substrate, a method (Japanese Patent Laid-Open No. 1998-77321) involving the incorporation of e.g., a thermoplastic resin in the photocurable composition which is a starting material constituting the substrate disclosed in the above cited publication and a method (Japanese Patent Laid-Open No. 1998-25621, Japanese Patent Laid-Open No. 1998-25624) involving the incorporation of other copolymerizable components in the photocurable composition are provided.

However, these improvements are disadvantageous in that since unpolymerizable components or components having different polymerization rates are incorporated, the properties inherent to photocurable composition are impaired, causing increase of birefringence, decrease of heat resistance and deterioration of water absorption and hence having adverse effects on production yield and cost reduction.

An object of the present invention is to provide a photocurable composition which, when photocured, provides a cured product that has an improved mechanical strength while maintaining its inherent properties such as low birefringence and high heat resistance, a cured product comprising same and a process for producing the same.

DISCLOSURE OF THE INVENTION

The inventors made extensive studies under these circumstances. As a result, it was found that the incorporation of a specific mono (meth) acrylate in the composition disclosed in Japanese Patent Laid Open No. 1997-152510 in a predetermined amount makes it possible to improve the mechanical strength thereof without impairing its inherent properties such as low birefringence and high heat resistance. The present invention has thus been worked out.

In other words, when a highly crosslinked high molecular structure comprises a non-crosslinked component having a structure and properties close to that of the high molecular substance incorporated therein, the mechanical strength thereof can be improved without increasing birefringence, decreasing heat resistance and deteriorating water absorption. As a result, the damage of the sheet can be lessened during the preparation of a plastic laminated product having a thickness as relatively small as from about 0.05 mm to 3 mm, preferably from about 0.1 mm to 1.5 mm.

This mono(meth)acrylate is produced as a precursor when bis (meth) acrylate is produced by the reaction of a diol form with (meth)acrylic acid or (meth)acrylic acid ester as starting materials and is a compound terminated by (meth) acryloyl group at one end thereof and by hydroxyl group at the other. Accordingly, by suspending the reaction in a stage before 100% progress of the reaction, the desired mixture of bis (meth) acrylate and mono (meth) acrylate can be easily obtained. This mono(meth)acrylate is analogous to bis (meth)acrylate in its chemical structure and thus is almost the same as bis(meth)acrylate in polymerization rate. Thus, this mono(meth)acrylate causes no increase of birefringence when cured by polymerization. Further, since this mono (meth)acrylate has an alicyclic skeleton similar to that of a specific bis (meth)acrylate, it has little effect on heat resistance and water absorption.

The essence of the present invention lies in:

1. A photocurable composition comprising the following components A, B and C (with the proviso that the proportion of the various components each are represented relative to 100 parts by weight of the sum of the weight of the components A and B):
   Component A: 70 to 99 parts by weight of an alicyclic skeleton-containing bis(meth)acrylate represented by the general formula (I):

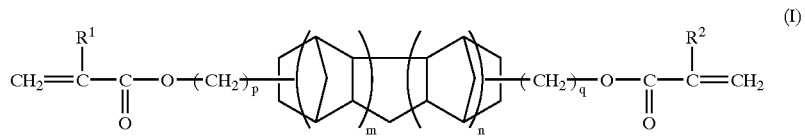

(wherein $R^1$ and $R^2$ each independently represent a hydrogen atom or methyl group; m represents 1 or 2; n represents 0 or 1; and p and q each independently represent 0, 1 or 2);

Component B: 1 to 30 parts by weight of an alicyclic skeleton-containing mono(meth)acrylate represented by the general formula (II):

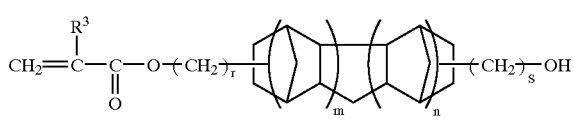

(wherein $R^3$ represents a hydrogen atom or methyl group; m represents 1 or 2; n represents 0 or 1; and r and s each independently represent 0, 1 or 2); and Component C: 1 to 10 parts by weight of a mercapto compound having a functionality of at least two.

2. A cured product obtained by the copolymerization of a photocurable composition comprising the following components A, B and C (with the proviso that the proportion of the various components each are represented relative to 100 parts by weight of the sum of the weight of the components A and B) in the presence of a radical polymerization initiator:

Component A: 70 to 99 parts by weight of an alicyclic skeleton-containing bis(meth)acrylate represented by the general formula (I):

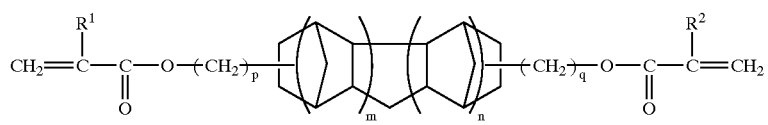

(wherein $R^1$ and $R^2$ each independently represent a hydrogen atom or methyl group; m represents 1 or 2; n represents 0 or 1; and p and q each independently represent 0, 1 or 2);

Component B: 1 to 30 parts by weight of an alicyclic skeleton-containing mono(meth)acrylate represented by the general formula (II):

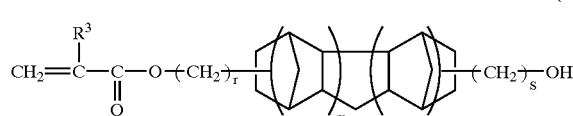

(wherein $R^3$ represents a hydrogen atom or methyl group; m represents 1 or 2; n represents 0 or 1; and r and s each independently represent 0, 1 or 2); and Component C: 1 to 10 parts by weight of a mercapto compound having a functionality of at least two.

3. A process for producing a cured product which comprises the copolymerization of a photocurable composition comprising the following components A, B and C (with the proviso that the proportion of the various components each are represented relative to 100 parts by weight of the sum of the weight of the components A and B) in the presence of a radical polymerization initiator:

Component A: 70 to 99 parts by weight of an alicyclic skeleton-containing bis(meth)acrylate represented by the general formula (I):

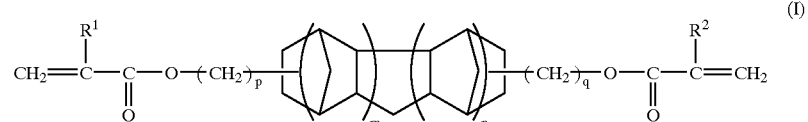

(wherein $R^1$ and $R^2$ each independently represent a hydrogen atom or methyl group; m represents 1 or 2; n represents 0 or 1; and p and q each independently represent 0, 1 or 2);

Component B: 1 to 30 parts by weight of an alicyclic skeleton-containing mono(meth)acrylate represented by the general formula (II):

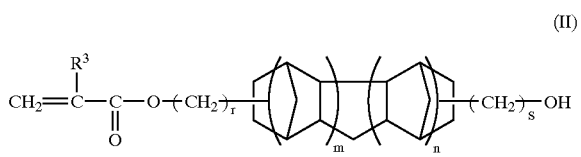
(II)

(wherein $R^3$ represents a hydrogen atom or methyl group; m represents 1 or 2; n represents 0 or 1; and r and s each independently represent 0, 1 or 2); and Component C: 1 to 10 parts by weight of a mercapto compound having a functionality of at least two.

Figure 1:
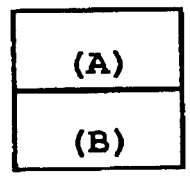
FIG. 1 illustrates an embodiment of the plastic laminated product of the present invention.

In these drawings, the signs A, B and C indicate a low birefringence plate, a gas barrier layer, and a cured layer, respectively.

BEST MODE FOR CARRYING OUT THE INVENTION

The present invention will be further described hereinafter.

(Photocurable Composition)

The photocurable composition of the present invention comprises components A, B and C.

The term "comprising" as used herein is meant to indicate that a small amount of auxiliary components may be incorporated in the photocurable composition besides the listed components A, B and C so far as it impairs the gist of the present invention.

The term "(meth) acryl" as used herein is a general term for acryl and methacryl, and the term "(meth) acrylate" as used herein is a general term for acrylate and methacrylate.

<Component A: Alicyclic Skeleton-Containing Bis(Meth) Acrylate>

The component A is a bis(meth)acrylate having an alicyclic hydrocarbon skeleton (hereinafter occasionally abbreviated as "alicyclic skeleton-containing bis (meth) acrylate or bis(meth)acrylate") represented by the formula (I):

(wherein $R^1$ and $R^2$ each independently represent a hydrogen atom or methyl group; m represents 1 or 2; n represents 0 or 1; and p and q each independently represent 0, 1 or 2)

Specific examples of the alicyclic skeleton-containing bis(meth)acrylate of the formula (I) include bis(hydroxy) tricyclo[5.2.1.0$^{2,6}$]decane=diacrylate, bis(hydroxy)tricyclo [5.2.1.0$^{2,6}$]decane=dimethacrylate, bis(hydroxy)tricyclo [5.2.1.0$^{2,6}$]decane=acrylate methacrylate, and mixture thereof, bis(hydroxy)pentacyclo[6.5.1.1$^{3,6}$.0$^{2,7}$.0$^{9,13}$] pentadecane=diacrylate, bis(hydroxy)pentacyclo[6.5.1.1$^{3,6}$.0$^{2,7}$.0$^{9,13}$]pentadecane=dimethacrylate, bis(hydroxy) pentacyclo[6.5.1.1$^{3,6}$.0$^{2,7}$.0$^{9,13}$]pentadecane=acrylate methacrylate, and mixture thereof, bis(hydroxymethyl) tricyclo[5.2.1.0$^{2,6}$]decane=diacrylate, bis(hydroxymethyl) tricyclo[5.2.1.0$^{2,6}$]decane=dimethacrylate, bis (hydroxymethyl)tricyclo[5.2.1.0$^{2,6}$]decane=acrylate methacrylate, and mixture thereof, bis(hydroxymethyl) pentacyclo[6.5.1.1$^{3,6}$.0$^{2,7}$.0$^{9,13}$]pentadecane=diacrylate, bis (hydroxymethyl)pentacyclo[6.5.1.1$^{3,6}$.0$^{2,7}$.0$^{9,13}$] pentadecane=dimethacrylate, bis(hydroxymethyl) pentacyclo[6.5.1.1$^{3,6}$.0$^{2,7}$.0$^{9,13}$]pentadecane=acrylate methacrylate, and mixture thereof, bis(hydroxyethyl) tricyclo[5.2.1.0$^{2,6}$]decane=diacrylate, bis(hydroxyethyl) tricyclo[5.2.1.0$^{2,6}$]decane=dimetharylate, bis(hydroxyethyl) tricyclo[5.2.1.0$^{2,6}$]decane=acrylate methacrylate, and mixture thereof, bis(hydroxyethyl)pentacyclo[6.5.1.1$^{3,6}$.0$^{2,7}$.0$^{9,13}$]pentadecane=diacrylate, bis(hydroxyethyl)pentacyclo [6.5.1.1$^{3,6}$.0$^{2,7}$.0$^{9,13}$]pentadecane=dimethacrylate, bis (hydroxyethyl)pentacyclo[6.5.1.1$^{3,6}$.0$^{2,7}$.0$^{9,13}$] pentadecane=acrylate methacrylate, and mixture thereof, bis(hydroxyethyl) tricyclo[5.2.1.0$^{2,6}$]decane=diacrylate, bis (hydroxyethyl) tricyclo[5.2.1.0$^{2,6}$]decane=dimethacrylate, bis(hydroxyethyl) tricyclo[5.2.1.0$^{2,6}$]decane=acrylate methacrylate, and mixture thereof, bis(hydroxyethyl) pentacyclo[6.5.1.1$^{3,6}$.0$^{2,7}$.0$^{9,13}$]pentadecane=diacrylate, bis (hydroxyethyl)pentacyclo[6.5.1.1$^{3,6}$.0$^{2,7}$.0$^{9,13}$] pentadecane=dimethacrylate, bis(hydroxyethyl)pentacyclo [6.5.1.1$^{3,6}$.0$^{2,7}$.0$^{9,13}$]pentadecane=acrylate methacrylate, and mixture thereof.

Preferred among these compounds are bis (hydroxymethyl) tricyclo[5.2.1.0$^{2,6}$]decane=diacrylate, bis (hydroxymethyl)tricyclo[5.2.1.0$^{2,6}$]decane=dimethacrylate, bis(hydroxymethyl)tricyclo[5.2.1.0$^{2,6}$]decane=acrylate methacrylate, and mixture thereof.

Two or more of these tricyclodecane compounds and pentacyclodecane compounds in the same and/or different groups may be used in combination.

The proportion of bis(meth)acrylate in the photocurable composition of the present invention is from 70 to 99 parts by weight, preferably from 80 to 98 parts by weight, more preferably from 88 to 97 parts by weight, particularly from 92 to 96 parts by weight based on 100 parts by weight of the sum of the weight of the components A and B (hereinafter occasionally referred to as "total content of acrylates").

The process for producing bis(meth)acrylate is not specifically limited but may be carried out according to an ordinary ester synthesis method ("Synthesis and Reaction of Organic Compounds (II)", The Chemical Society of Japan, New Institute of Experimental Chemistry, 14, Maruzen,

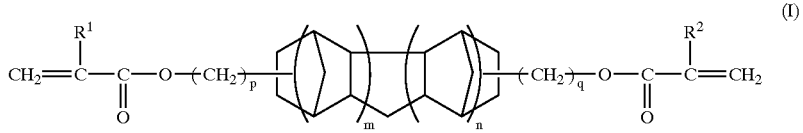
(I)

1977), etc. Representative examples of the process for producing bis(meth)acrylate include:

(i) A process involving the esterification reaction of an alicyclic skeleton-containing diol represented by the formula (1) (hereinafter occasionally abbreviated as "diol of the formula (1)" or "diol") with (meth)acrylic acid (Japanese Patent Laid-Open No. 1987-225508):

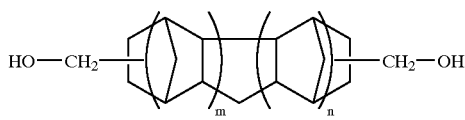

(1)

(wherein m represents 1 or 2; and n represents 0 or 1)

Specific examples of the compound of the formula (1) include bis(hydroxymethyl)tricyclo[$5.2.1.0^{2,6}$]decane, and bis(hydroxymethyl)pentacyclo[$6.5.1.1^{3,6}.0^{2,7}.0^{9,3}$] pentadecane. Among these compounds, bis(hydroxymethyl) tricyclodecane is commercial available as "TCD Alcohol DM (trade name of a product produced by Celanese Inc.);

(ii) A process involving the ester exchange reaction of diol with (meth)acrylic acid ester;

(iii) A process involving the reaction of diol with (meth) acrylic acid halide, etc.

Practical and preferred among these methods are the methods (i) and (ii).

The esterification reaction of diol with (meth)acrylic acid as the method (i) is normally carried out by reacting 1 mol of diol with from 2.0 to 2.6 mols of (meth)acrylic acid using as a catalyst sulfuric acid, hydrochloric acid, phosphoric acid, boron fluoride, P-toluenesulfonic acid, benzenesulfonic acid, cationic ion exchange resin or the like normally in the presence of a solvent such as toluene, benzene, heptane and hexane while water produced thereby is being distilled off. Further, the ester exchange reaction of diol with (meth)acrylic acid ester as the method (ii) is normally carried out by reacting 1 mol of diol with from 2.0 to 10.0 mols of methyl (meth)acrylate using as a catalyst sulfuric acid, P-toluenesulfonic acid, tetrabutyl titanate, tetraisopropyl titanate, potassium butoxide or the like normally in the presence of a solvent such as toluene, benzene, heptane and hexane while methanol produced thereby is being distilled off.

In the reaction, as a polymerization inhibitor there may be used, e.g., hydroquinone, hydroquinone monomethyl ether, phenothiazine, copper salt or the like.

In these reactions, the progress of the reaction is analyzed by a high-performance liquid chromatography, gas chromatography or the like. The reaction is then suspended in the stage before 100% completion. The unreacted diol, (meth) acrylic acid, catalyst, polymerization inhibitor, solvent, etc. are removed from the reaction mixture to obtain a mixture of bis(meth)acrylate and mono(meth)acrylate.

A mixture of bis (meth) acrylate and mono (meth) acrylate in a proper proportion can be used as a mixture of component (A) and component (B) constituting the photocurable composition of the present invention as it is to advantage for the sake of convenience.

<Component B: Alicyclic Skeleton-Containing Mono (Meth)Acrylate>

The component B is a mono(meth)acrylate having an alicyclic hydrocarbon skeleton represented by the formula (II) (hereinafter occasionally abbreviated as "alicyclic skeleton-containing mono(meth)acrylate or mono(meth) acrylate).

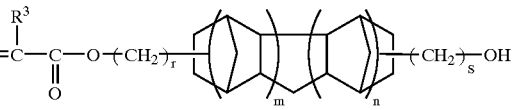

(II)

(wherein $R^3$ represents a hydrogen atom or methyl group; m represents 1 or 2; n represents 0 or 1; and r and s each independently represent 0, 1 or 2)

Specific examples of the alicyclic skeleton-containing mono(meth)acrylate of the formula (II) include bis(hydroxy) tricyclo[$5.2.1.0^{2,6}$]decane=monoacrylate, bis(hydroxy) tricyclo[$5.2.1.0^{2,6}$]decane=monomethacrylate, and mixture thereof, bis(hydroxy)pentacyclo[$6.5.1.1^{3,6}.0^{2,7}.0^{9,13}$] pentadecane=monoacrylate, bis(hydroxy)pentacyclo [$6.5.1.1^{3,6}.0^{2,7}.0^{9,13}$]pentadecane=monomethacrylate, and mixture thereof, bis(hydroxymethyl)tricyclo[$5.2.1.0^{2,6}$] decane=monoacrylate, bis(hydroxymethyl)tricyclo[$5.2.1.0^{2,6}$]decane=monomethacrylate, and mixture thereof, bis (hydroxymethyl)pentacyclo[$6.5.1.1^{3,6}.0^{2,7}.0^{9,13}$] pentadecane=monoacrylate, bis(hydroxymethyl)pentacyclo [$6.5.1.1^{3,6}.0^{2,7}.0^{9,13}$]pentadecane=monomethacrylate, and mixture thereof, bis (hydroxyethyl)tricyclo[$5.2.1.0^{2,6}$] decane=monoacrylate, bis(hydroxyethyl)tricyclo[$5.2.1.0^{2,6}$] decane=monomethacrylate, and mixture thereof, bis (hydroxyethyl)pentacyclo[$6.5.1.1^{3,6}.0^{2,7}.0^{9,13}$] pentadecane=monoacrylate, bis(hydroxyethyl)pentacyclo [$6.5.1.1^{3,6}.0^{2,7}.0^{9,13}$]pentadecane=monomethacrylate, and mixture thereof, etc.

Preferred among these compounds are bis (hydroxymethyl)tricyclo[$5.2.1.0^{2,6}$]decane=monoacrylate, bis(hydroxymethyl)tricyclo[$5.2.1.0^{2,6}$]decane= monomethacrylate, and mixture thereof.

Two or more of these tricyclodecane compounds and pentacyclodecane compounds in the same and/or different groups may be used in combination.

The proportion of mono(meth)acrylate in the photocurable composition of the present invention is from 1 to 30 parts by weight, preferably from 2 to 20 parts by weight, more preferably from 3 to 12 parts by weight, particularly from 4 to 8 parts by weight based on 100 parts by weight of the total content of acrylates.

When the proportion of mono(meth)acrylate is too small, a desired effect of improving the mechanical strength of the cured product cannot be exerted. On the contrary, when the proportion of mono(meth)acrylate is too large, the cured product has a decreased heat resistance.

Such a mono(meth)acrylate can be synthesized by carrying out the synthesis of bis(meth)acrylate of the formula (I), e.g., method (i) or (iii) under the conditions such that a half ester is produced, e.g., by reducing the amount of (meth) acrylic acid relative to 1 mol of diol to half the predetermined amount, i.e., from 1 to 1.3 mols or reducing the amount of (meth) acrylic acid halide relative to 1 mol of diol to half the predetermined amount, i.e., 1 mol.

However, by suspending the reaction in its course during the synthesis of the aforementioned bis(meth)acrylate of the formula (I), e.g., by the method (i) as mentioned above, a mixture of bis(meth)acrylate containing a desired amount of mono(meth)acrylate can be obtained. This mixture can be used as a starting material of the photocurable composition of the present invention as it is. It is thus not necessary that mono(meth)acrylate be separately synthesized.

<Component C: Mercapto Compound Having a Functionality of at Least Two>

The mercapto compound to be used in the photocurable composition of the present invention is a mercapto compound having a functionality of at least two, preferably three or more (hereinafter occasionally referred to as "polyfunctional mercapto compound").

Specific examples of the mercapto compound having a functionality of at least two include compounds represented by the general formulae (III), (IV) and (V), 2,2-bis(2-hydroxy-3-mercaptopropoxyphenyl)propane, 1,10-decanedithiol, dimercapto-triethylene disulfide, dimercapto compound synthesized by the reaction of a diglycidyl compound such as polyethylene glycol diglycidyl ether and polypropylene glycol diglycidyl ether with hydrogen sulfide, etc.

(III)

(wherein $R^4$ represents a methylene group or ethylene group; $R^5$ represents a $C_2$–$C_{15}$ hydrocarbon residue which may contain an ether oxygen; and a represents an integer of from 2 to 6)

In the formula (III), $R^5$ is a $C_2$–$C_{15}$ hydrocarbon residue which may contain an ether oxygen. Specific examples of the $C_2$–$C_{15}$ hydrocarbon residue include pentaerythritol residue, dipentaerythritol residue, trimethylolpropane residue, ethylene glycol residue, diethylene glycol residue, triethylene glycol residue, butanediol residue, etc.

The mercapto compound of the formula (III) is a divalent to hexavalent thioglycolic acid ester or thiopropionic acid ester. Specific examples of such a mercapto compound include pentaerythritoltetrakis(β-thiopropionate), pentaerythritol tetrakis(thioglycolate), trimethylolpropanetris (β-thiopropionate), trimethylolpropanetris(thioglycolate), ethylene glycolbis(β-thiopropionate), ethyleneglycolbis (thioglycolate), diethyleneglycolbis(β-thiopropionate), diethyleneglycolbis (thioglycolate), triethyleneglycolbis(β-thiopropionate), triethyleneglycol(thioglycolate), butanediolbis(β-thiopropionate), butanediolbis (thioglycolate), dipentaerythritolhexakis(β-thiopropionate), dipentaerythritolhexakis(thioglycolate), etc.

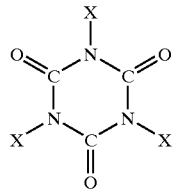

(IV)

(wherein X represents HS—$(CH_2)_b$—CO—$(OCH_2CH_2)_d$—$(CH_2)_c$—, with the proviso that b and c each independently represent an integer of from 1 to 8; and d represents 0, 1 or 2)

The compound of the formula (IV) is a β-thiol group-containing isocyanate. Specific examples of the compound of the formula (IV) include tris[2-(β-thiopropionyloxy) ethyl]isocyanurate, tris(2-thio-glyconyloxyethyl) isocyanurate, tris[2-(β-thioglyconyl-oxyethoxy)ethyl] isocyanurate, tris(2-thioglyconyloxy-ethoxy)ethyl) isocyanurate, tris[3-(β-thiopropionyloxy)propyl] isocyanurate, tris(3-thioglyconyloxy-propyl) isocyanurate, etc.

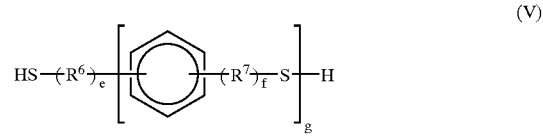

(V)

(wherein $R^6$ and $R^7$ each independently represent an alkylene group; e and f each independently represent 0 or 1; and g represents 1 or 2)

The compound of the formula (V) is a thiol group-containing hydrocarbon. Specific examples of the compound of the formula (V) include benzenedimercaptan, xylylene dimercaptan, 4,4'-dimercaptodiphenyl sulfide, etc.

Preferred among these mercapto compounds having a functionality of at least two are compounds represented by the formulae (III), (IV) and (V). Even more desirable among these compounds are mercapto compounds having a functionality of three or more. Particularly preferred among these compounds are tetrafunctional mercapto compounds.

The mixing proportion of the mercapto compound having a functionality of at least two in the photocurable composition of the present invention is from 1 to 10 parts by weight, preferably from 4 to 8 parts by weight based on 100 parts of the total content of acrylates.

When the proportion of the mercapto compound is too small, the cured product has an increased birefringence. On the contrary, when the proportion of the mercapto compound is too large, the cured product has a decreased heat resistance.

Even a composition obtained by removing the aforementioned alicyclic skeleton-containing mono(meth)acrylate as the component B from the photocurable composition of the present invention can meet only the two requirements, i.e., low birefringence and high heat resistance. In other words, by subjecting a composition comprising the aforementioned alicyclic skeleton-containing bis(meth)acrylate as the component A and the aforementioned polyfunctional mercapto compound as the component C to curing by photopolymerization, a resin having a low birefringence and a high heat resistance can be obtained. The reason for the incorporation of the polyfunctional mercapto compound is as follows. (1) The thiol group in the mercapto compound acts as a chain transfer agent to allow curing by polymerization to proceed slowly and uniformly, drastically lowering the birefringence in the cured product. (2) The use of the polyfunctional mercapto compound having two or more thiol groups per molecule makes it possible to solve the aforementioned birefringence problem without impairing the heat resistance of the cured product when the mercaptan compound enters in a three-dimensional network structure formed by the bis(meth)acrylate compound as the component A.

However, since both the components A and C are polyfunctional and the resulting cured product has a highly crosslinked high molecular structure, the cured product is disadvantageous in that it is poor in mechanical strength such as impact resistance. This problem can be solved by incorporating the aforementioned alicyclic skeleton-containing mono(meth)acrylate as the component B in a predetermined proportion. In other words, when the component B, which is monofunctional and thus makes no contribution to crosslinking, enters in the highly crosslinked polymer, the crosslink density can be properly controlled. As a result, the mechanical strength such as impact resistance can be enhanced. At the same time, problems of production yield such as cracking of product during forming can be solved.

It is important to prevent the increase of birefringence of the cured product, the decrease of heat resistance of the cured product or the deterioration of water absorption of the cured product when the component B is incorporated therein. Since the component B in the present invention is a (meth)acrylate having the same alicyclic skeleton as in the component A, the two components have almost the same polymerization speed. Further, since the component B undergoes no phase separation, the cured product shows no change of birefringence. Referring to heat resistance and water absorption, the cured products prepared from the components A and B have similar properties and thus maintain sufficient properties as cured product for liquid crystal display without impairing the properties.

The photocurable composition of the present invention may comprise the components D and E incorporated therein besides the components A to C to prevent the coloring of the resulting cured product.

<Component D: Phenol Compound>

The component D is a phenol compound represented by the general formula (VI) or (VII):

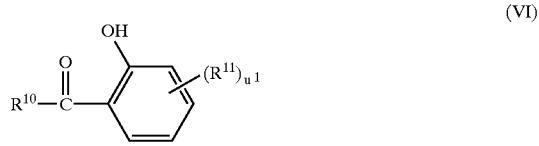

(VI)

In the formula (VI), $R^{10}$ represents an OH group, a phenyl (oxy) group which may be substituted by a $C_1$–$C_4$ alkyl group or $C_1$–$C_4$ alkoxy group. The alkyl group preferably represents a methyl group, and the alkoxy group preferably represents a methoxy group.

$R^{11}$ represents a group selected from the group consisting of an OH group, $C_1$–$C_4$ alkoxy group, $SO_3H$ group and $SO_3Na$ group, with the proviso that when there are a plurality of $R^{11}$'s, the plurality of $R^{11}$'s may be the same or different. The alkoxy group preferably represents a methoxy group.

$u^1$ represents an integer of from 0 to 2.

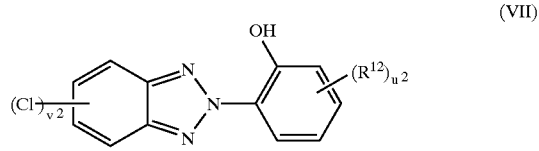

(VII)

In the formula (VII), $R^{12}$ represents a group selected from the group consisting of $C_1$–$C_{12}$ alkyl group and $C_1$–$C_8$ alkoxy group, with the proviso that when there are a plurality of $R^{12}$'s, the plurality of $R^{12}$'s may be the same or different. Preferred among the groups represented by $R^{12}$ is $C_1$–$C_8$ alkoxy group.

$u^2$ represents an integer of from 0 to 2. $v^2$ represents an integer of 0 or 1.

The component D more preferably is a phenol compound represented by the general formula (VIII):

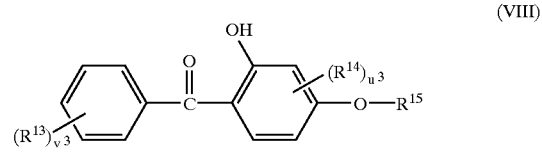

(VIII)

In the formula (VIII), $R^{13}$ represents an OH group or $C_1$–$C_4$ alkoxy group. The alkoxy group preferably represents a methoxy group.

$R^{14}$ represents an $SO_3H$ group or $SO_3Na$ group.

$R^{15}$ represents a hydrogen atom, $C_1$–$C_4$ alkyl group or benzyl group. The alkyl group preferably represents a methyl group, and the benzyl group preferably represents a dimethylbenzyl group.

$u^3$ represents a number of 0 or 1. $v^3$ represents an integer of from 0 to 2.

Specific examples of the component D include benzotriazole compounds such as 2-(2'-hydroxy-5'-methylphenyl) benzotriazole, 2-(2'-hydroxy-5'-t-butyl-phenyl) benzotriazole, 2-(2'-hydroxy-5'-t-octylphenyl)benzotriazole, 2-(2'-hydroxy-4'-octoxyphenyl)benzotriazole, 2-(2'-hydroxy-3',5'-di-butylphenyl)benzotriazole, 2-(2'-hydroxy-3',5'-di-t-amylphenyl)benzotriazole, 2-(2'-hydroxy-3'-dodecyl-5'-methyl-phenyl)benzotriazole, 2-(2'-hydroxy-3',5'-bis(α,α-dimethylbenzyl)phenylbenzotriazole, 2-[2'-hydroxy-3'-(3",4",5",6"-tetraphthalimidemethyl)-5'-methylphenyl]benzotriazole, 2-(2'-hydroxy-3'-t-butyl-5'-methylphenyl)-5-chlorobenzotriazole, 2-(2'-hydroxy-3',5'-di-t-butylphenyl)-5-chlorobenzotriazole, 2,2'-methylene-bis [4-(1,1,3,3-tetramethylbutyl)-6-(2H-benzotriazole-2-yl) phenol]and methyl-3-[3-t-butyl-5-(2H-benzotriazole-2-yl)-4-hydroxyphenylpropionate], 4-hydroxybenzophenone-based compounds such as 2,4-dihydroxybenzophenone and 2,2',4,4',-tetrahydroxybenzophenone, 4-methoxybenzophenone-based compounds such as 2-hydroxy-4-methoxybenzophenone, 2-hydroxy-4-methoxy-2'-carboxybenzophenone, 2-hydroxy-4-methoxy-5-sulfoxybenzophenone, 2,2'-dihydroxy-4-methoxybenzophenone, 2,2'-dihydroxy-4,4',-dimethoxybenzophenone, 2,2'-dihydroxy-4,4'-dimethoxy-6-sodium sulfoxybenzophenone and bis(5-benzoyl-4-hydroxy-2-methoxyphenyl)methane, 4-n-octoxybenzophenone-based compounds such as 2-hydroxy-4-n-octoxybenzophenone, 4-n-dodecyloxybenzophenone-based compounds such a 2-hydroxy-4-n-dodecyloxybenzophenone, benzophenone-based compounds such as 4-benzyloxy-benzophenone (e.g., 2-hydroxy-4-benzyloxybenzo-phenone), salicylate-based compounds such as phenyl salicylate, 4-t-butylphenyl salicylate and 4-t-octylphenyl salicylate, etc.

Two or more of these phenol compounds may be used in combination.

Particularly preferred among these compounds are benzophenone-based compounds represented by the general formula (VI). Particularly preferred among these benzophenone-based compounds are a compound having a 4-methoxybenzophenone structure represented by the general formula (VIII) because it exerts an extremely great effect of inhibiting the coloring of the cured product thus obtained. Mostly preferred among these compounds is 2-hydroxy-4-methoxybenzophenone.

The incorporation of a phenol compound having a specific structure as component D makes it possible to drastically inhibit the coloring, particularly the rise of yellowness index (YI) of the cured product during the curing of the photocurable composition or at the step of irradiation with active energy rays during the use of the cured product.

The mechanism by which a phenol compound having such a specific structure prevents the coloring of the cured product to drastically enhance the transparency thereof is not necessarily known. However, the following mechanisms are presumed to be main reasons for the phenomenon that even when incorporated in a small amount, the component D prevents coloring during the production of plastic substrate and at the paneling step.

(1) In the system of the present invention, when irradiated with active energy rays, the phenolic hydroxyl group and its adjacent nitrogen atoms or ketone group make effective interaction on each other in their electronic state to absorb the energy of the active energy rays. Thereafter, the energy is converted to a relatively small heat energy via molecule oscillation energy, effectively inhibiting the generation of radicals by active energy rays;
(2) Particularly in the case where there is contained a benzophenone-based structure, the absorption of energy of active energy rays by the action of the phenolic hydroxyl group in the system of the present invention with its adjacent ketone group in their electronic state can be more effectively effected;
(3) Further, in the case the benzophenone-based compound has a methoxy group in the position para to the ketone group, a good compatibility with the system of the present invention can be established, allowing extremely effective energy absorption.

Further, since the phenol compound having a specific structure has an excellent compatibility with the other components of the composition of the present invention, an effect of improving the coloring resistance can be exerted even when the phenol compound is added only in a minimum amount.

The proportion of the phenol compound in the photocurable composition of the present invention is normally from 0.02 to 1 part by weight, preferably from 0.05 to 0.8 part by weight based on 100 parts by weight of the total content of acrylates. When the proportion of the phenol compound is too small, the effect of inhibiting coloring cannot be exerted. On the contrary, when the proportion of the phenol compound is too large, it causes coloring by the phenol compound itself or deterioration of other properties such as mechanical strength and light transmittance of the cured product to disadvantage.

<Component E: Compound Having 3,5-di-tert-butyl-4-hydroxyphenyl Group>

The compound having 3,5-di-tert-butyl-4-hydroxyphenyl group to be used in the photocurable composition of the present invention is preferably a compound having two or more 3,5-di-tert-butyl-4-hydroxyphenyl groups, more preferably a compound represented by the general formula (IX) or (X):

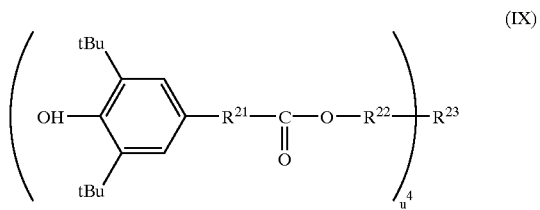

In the formula (IX), $R^{21}$ represents an alkylene group, preferably an alkylene group having two or more carbon atoms, particularly a $C_2$–$C_5$ alkylene group, even more preferably a $C_2$–$C_3$ alkylene group, even particularly an alkylene group having two carbon atoms.

$R^{22}$ represents an alkylene group, preferably an alkylene group having one or more carbon atoms, particularly a $C_1$–$C_5$ alkylene group, more preferably a methylene group or ethylene group, even particularly a methylene group.

$R^{23}$ represents an alkyl group or sulfur atom, preferably a $C_1$–$C_2$ alkyl group or sulfur atom, particularly a $C_1$–$C_2$ alkyl group.

When $R^{23}$ is an alkyl group, $u^4$ represents an integer of 2 or more, preferably 2 or 4, particularly 4.

When $R^{23}$ is a sulfur atom, $u^4$ represents 2.

tBu represents a tert-butyl group.

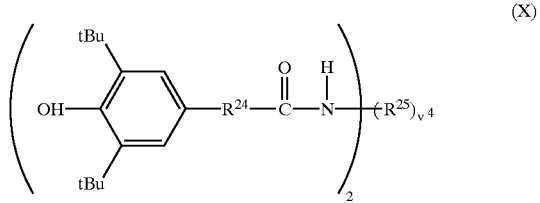

In the formula (X), $R^{24}$ represents an alkylene group, preferably a $C_1$–$C_4$ alkylene group, particularly an alkylene group having two carbon atoms.

$R^{25}$ represents an alkylene group, preferably a $C_2$–$C_{10}$ alkylene group, particularly an alkylene group having 6 carbon atoms.

$v^4$ represents 0 or 1.

tBu represents a tert-butyl group.

The incorporation of the component E makes it possible to drastically inhibit the coloring, particularly the rise of yellowness index (YI) of the cured product during the curing of the photocurable composition or at the step of heating during the use of the cured product.

Specific examples of the component E include compounds having one 3,5-di-tert-butyl-4-hydroxyphenyl group such as 2,6-di-tert-butylphenol, 2,6-di-tert-butyl-p-cresol, 2,4,6-tri-tert-butylphenol, 2,6-di-tert-butyl-4-s-butylphenol, 2,6-di-tert-butyl-4-hydroxymethylphenol, n-octadecyl-β-(4'-hydroxy-3',5'-di-tert-butylphenyl)propionate, 2,6-di-tert-butyl-4-(N,N-dimethylaminomethyl)phenol, 3,5-di-tert-butyl-4-hydroxybenzyl phosphonate-diethylester and 2,4-bis(n-octylthio)-6-(4-hydroxy-3',5'-di-tert-butylanilino)-1,3,5-triazine, and compounds having two or more 3,5-di-tert-butyl-4-hydroxyphenyl groups such as 4,4-methylene-bis(2,6-di-tert-butylphenol), 1,6-hexanediolbis[3-(3,5-di-tert-butyl-4-hydroxyphenyl)propionate], bis(3,5-di-tert-butyl-4-hydroxybenzyl)sulfide, 4,4'-di-thiobis(2,6-di-tert-butylphenol), 4,4'-tri-thiobis(2,6-di-tert-butylphenol), 2,2-thiodiethylenebis[3-(3,5-di-tert-butyl-4-hydroxy-phenyl)propionate], N,N'-hexamethylenebis(3,5-di-tert-butyl-4-hydroxy cinnamide, N,N'-bis[3-(3,5-di-tert-butyl-4- hydroxyphenyl) propionyl]hydrazine, calcium (3,5-di-tert-butyl-4-hydroxybenzyl) monoethylphosphonate, 1,3,5-trimethyl-2,4,6-tris(3,5-di-tert-butyl-4-hydroxybenzyl)benzene, tris(3,5-di-tert-butyl-4-hydroxyphenyl)isocyanurate, tris(3,5-di-tert-butyl-4-hydroxy benzyl)isocyanurate, 1,3,5-tris-2[3(3,5-di-tert-butyl-4-hydroxyphenyl)propionyloxy]ethylisocyanate, tetrakis[methylene-3-(3',5'-di-tert-butyl-4-hydroxyphenyl)propionate]and 3,5-di-tert-butyl-4-hydroxybenzylphosphite-diethylester.

Two or more compounds having 3,5-di-tert-butyl-4-hydroxyphenyl groups may be used in combination.

Preferred among these compounds are compounds corresponding to the general formula (IX) such as 1,6-hexanediolbis[3-(3,5-di-tert-butyl-4-hydroxyphenyl)propionate]:

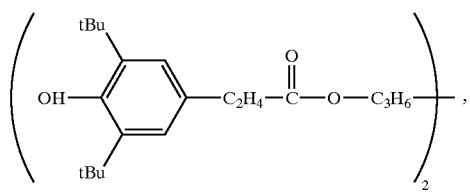

, 2,2-thiodiethylenebis[3-(3,5-di-tert-butyl-4-hydroxyphenyl)propionate]:

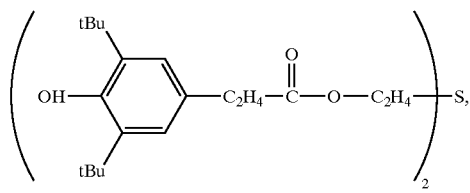

, tetrakis[methylene-3-(3',5'-di-tert-butyl-4-hydroxyphenyl)propionate]:

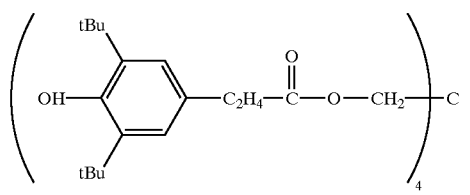

Particularly preferred among these compounds is tetrakis[methylene-3-(3',5'-di-tert-butyl-4-hydroxyphenyl)propionate] because it exerts a great effect of inhibiting coloring.

The mechanism by which the compound having a specific structure inhibits the coloring of the cured product is not necessarily known. However, the following mechanisms are presumed to be main reasons for the phenomenon that even when incorporated in a small amount, the component E exerts an effect of remarkably preventing coloring of the cured product.

(1) In the case where there are contained a plurality of 3,5-di-tert-butyl-4-hydroxyphenyl groups, the generation of radicals deteriorating the color hue particularly in the cured product can be efficiently inhibited;
(2) The 3,5-di-tert-butyl-4-hydroxyphenyl group is particularly suitable and effective for the inhibition of the generation of radicals of the other components (components A, B and C) of the photocurable composition of the present invention;
(3) Since the radical activation temperature of 3,5-di-tert-butyl-4-hydroxyphenyl group and the temperature at which the mobility of the high molecular structure formed by the other components (components A, B and C) increases are close to each other, the probability that the compound having a 3,5-di-tert-butyl-4-hydroxyphenyl group can trap the radicals is high, making it possible to efficiently inhibit the generation of radicals;
(4) Since the length of the molecular chain of the compound having a 3,5-di-tert-butyl-4-hydroxyphenyl group is close to the distance between the points at which radicals are generated in the three-dimensional network structure formed by the other components (components A, B and C), the generation of radicals can be effectively inhibited.

The proportion of the compound having a 3,5-di-tert-butyl-4-hydroxyphenyl group in the photocurable composition of the present invention is normally from 0.05 to 1 part by weight, preferably from 0.1 to 0.8 part by weight based on 100 parts by weight of the total content of acrylates. When the proportion of the compound having a 3,5-di-tert-butyl-4-hydroxyphenyl group is too small, the effect of inhibiting coloring cannot be obtained. On the contrary, when the proportion of the compound having a 3,5-di-tert-butyl-4-hydroxyphenyl group is too large, it causes coloring by the compound having a 3,5-di-tert-butyl-4-hydroxyphenyl group itself or deterioration of other properties such as mechanical strength and light transmittance of the cured product to disadvantage.

In order to copolymerize the photocurable composition of the present invention when irradiated with active energy rays, the photocurable composition comprises a radical polymerization initiator incorporated therein.

<Radical Polymerization Initiator>

The radical polymerization initiator (hereinafter occasionally referred to as "photopolymerization initiator" or "photoinitiator") to be used in the copolymerization of the photocurable composition of the present invention is not specifically limited so far as it generates radicals when irradiated with active energy rays such as ultraviolet ray. Specific examples of the radical polymerization initiator include compounds represented by the general formula (XI), acetophenone-based compounds, and benzophenone-based compounds.

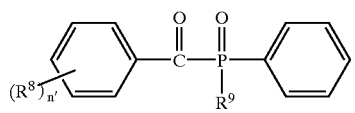

(XI)

(wherein $R^8$ represents a methyl group, methoxy group or chlorine atom; n' represents a number of 2 or 3; and $R^9$ represents a phenyl group or methoxy group)

Specific examples of the compound of the formula (XI) include acylphosphine oxides and acylphosphinic acid esters such as 2,6-dimethylbenzoyldiphenylphosphine oxide, 2,4,6-trimethylbenzoyldiphenylphosphine oxide, 2,4,6-trimethyl-benzoylphenylphosphinic acid methyl ester, 2,6-dichloro-benzoyldiphenylphosphine oxide and 2,6-dimethoxy-benzoyldiphenylphosphine oxide.

Specific examples of the acetophenone-based compound include 1-phenyl-2-hydroxy-2-methylpropane-1-one, 1-hydroxy-cyclohexylphenylketone, 4-diphenoxydichloroacetophenone, diethoxyacetophenone, 1-(4-isopropylphenyl)-2-hydroxy-2-methyl propane-1-one, etc.

Specific examples of the benzophenone-based compound include benzophenone, benzoylbenzoic acid methyl, 4-phenylbenzophenone, hydroxybenzophenone, 3,3'-dimethyl-4-methoxybenzophenone, diphenoxybenzophenone, etc.

Preferred among these compounds are 2,4,6-trimethylbenzoyldiphenylphosphine oxide, trimethylbenzoyl-phenyl phosphinic acid methyl ester, 1-hydroxy-cyclohexylphenylketone, benzophenone, and diphenoxybenzophenone. Particularly preferred among these compounds are 2,4,6-trimethylbenzoyldiphenylphosphine oxide and benzophenone.

Two or more of these photopolymerization initiators may be used in combination.

The amount of the photopolymerization initiator to be added is normally from 0.01 to 1 part by weight, preferably from 0.02 to 0.3 part by weight based on 100 parts by weight of the monomer. When the amount of the photopolymerization initiator to be added is too large, the polymerization proceeds suddenly, resulting in the production of a cured product having an increased birefringence or which can be colored. On the contrary, when the amount of the photopolymerization initiator to be added is too small, the composition cannot be thoroughly cured.

(Auxiliary Components)

As previously mentioned, the cured product and low birefringence material according to the present invention is obtained by polymerizing and curing a composition comprising components A, B and C and optionally components D and/or E, and the composition may comprise a small amount of auxiliary components incorporated therein. Accordingly, the photocurable composition of the present invention can be produced also by mixing 100 parts by weight of the composition before curing with other radical-polymerizable monomers in an amount of up to 30 parts by weight, and then subjecting the mixture to copolymerization. Examples of the other monomers to be used herein include (meth)acrylate compounds such as methyl (meth)acrylate, phenyl (meth) acrylate, 2-hydroxyethyl (meth)acrylate, methacryloyloxy methyl tetracyclodecane, methacryloyloxy methyl tetracyclodedecene, ethylene glycol di(meth) acrylate, diethylene glycol di(meth)acrylate, 1,6-hexenedioldi (meth) acrylate, bisphenol A diacrylate, bisphenol A dimethacrylate, bisphenol A acrylate methacrylate, and mixture thereof, bisphenol A bis[(oxyethyl)ether]=diacrylate, bisphenol A bis[(oxyethyl)ether]=dimethacrylate, bisphenol A bis[(oxyethyl)ether]= acrylate methacrylate, and mixture thereof, tetrabromobisphenol A bis[(oxyethyl)ether]=diacrylate, tetrabromobisphenol A bis[(oxyethyl)ether]=dimethacrylate, tetrabromobisphenol A bis[(oxyethyl)ether]=acrylate methacrylate, and mixture thereof, bisphenol A bis [(dioxyethyl)ether]=diacrylate, bisphenol A bis[(dioxyethyl) ether]=dimethacrylate, bisphenol A bis[(dioxyethyl)ether]= acrylate methacrylate, and mixture thereof, bisphenol A bis[(polyoxyethyl)ether]=diacrylate, bisphenol A bis [(polyoxyethyl)ether]=dimethacrylate, bisphenol A bis [(polyoxyethyl)ether]=acrylate methacrylate, 2,2'-bis[4-(β-methacryloyloxyethoxy)cyclohexyl]propane, 1,4-bis (methacryloyloxyethoxy)cyclohexyl]propane, 1,4-bis (methacryloyloxymethyl)cyclohexane and trimethylolpropane tri(meth)acrylate, nucleus- and/or side chain-substituted styrenes such as styrene, chlorostyrene, divinylbenzene and α-methylstyrene, etc.

Particularly preferred among these other monomers are methacryloyloxy methyl cyclodecane, 2,2-bis[4-(β-methacryloyloxyethoxy)phenyl]propane, 2,2-bis[4-(β-methacryloyloxyethoxy)cyclohexyl]propane, 1,4-bis (methacryloyloxymethyl)cyclohexane, and mixture thereof.

Other examples of the auxiliary components include oxidation inhibitor, ultraviolet absorber, dye, pigment, filler, etc.

(Preparation of Cured Product)
<Copolymerization of Photocurable Composition>

The photocurable composition of the present invention can be easily subjected to copolymerization when irradiated with active energy rays in the presence of a radical polymerization initiator (hereinafter occasionally referred to as "photopolymerization", "photopolymerization curing" or "photocuring").

The active energy rays are not specifically limited so far as they act on the radical polymerization initiator to generate radicals. For example, electron rays, ultraviolet rays, etc. may be used. As the source for active energy rays there may be used chemical lamp, xenon lamp, low pressure mercury lamp, high pressure mercury lamp, metal halide lamp or the like.

Among these active energy rays, ultraviolet rays having a wavelength of from 200 to 400 nm are preferably emitted at a dose of from 0.1 to 200 j taking into account the kind and amount of monomer and polymerization initiator.

When the dose is extremely small, the resulting polymerization is incomplete, providing a cured product which cannot exhibit sufficient heat resistance and mechanical properties. On the contrary, when the dose is extremely excessive, the resulting cured product undergoes deterioration by light such as coloring represented by yellowing.

The irradiation with active energy rays may be effected in one stage but is preferably effected in a plurality of stages, at least two stages, to obtain a sheet having good surface conditions.

In the case where the irradiation with active energy rays is effected in two stages, the active energy rays are emitted in the first stage at a dose of not greater than 15%, preferably not greater than 10%, particularly not greater than 7% of that required for curing to gel the photocurable resin in the cavity in such an arrangement that it can maintain its shape itself, that is, it does not leak even when the spacer is removed. The term "dose of active energy rays required for curing" as used in the specification is meant to indicate the dose required to eliminate 80% of ethylenic carbon-carbon double bond in the resin composition in the cavity. The percent elimination of ethylenic carbon-carbon double bond by the irradiation with active energy rays is calculated by the following equation:

$$\text{Percent elimination} = (1 - K/M) \times 100 (\%)$$

wherein $M = A_M/B_M$ $A_M$: Peak area of double bond in infrared absorption before irradiation with active energy rays $B_M$: Peak area of C—H bond in infrared absorption before irradiation with active energy rays $K = A_K/B_K$ $A_K$: Peak area of double bond in infrared absorption after irradiation with active energy rays $B_K$: Peak area of C—H bond in infrared absorption after irradiation with active energy rays The peak of double bond appears at a wavelength of from 1658.5 to 1591 cm$^{-1}$ and the peak of C—H bond appears at a wavelength of from 3210 to 2809.8 cm$^{-1}$.

When the dose of active energy rays in the first stage exceeds 15% of the dose required for curing, the photocurable resin undergoes curing and shrinkage, causing the resin in the cavity to be peeled off the plate and hence making it likely that the resulting resin sheet can have defects on the surface thereof. It is also disadvantageous in that the gelled resin adheres firmly to the spacer, making it difficult for the spacer to be removed. Preferably, a means for keeping the distance between the plates constant is released in the stage where the dose is not greater than 10% of the dose required for curing. On the contrary, when the dose of active energy rays is too low, insufficient gelation occurs, causing an accident of leakage of the resin in the cavity through the gap between the forming molds when the tension of the plate of the forming mold is relaxed. Further, the adhesion between the gelled resin and the plate is weak, occasionally causing an accident of peeling of the resin from the plate due to impact developed when the tension of the plate of the forming mold is relaxed.

Subsequently, in the second stage, irradiation is effected in such a manner that from 95% to 100% of the monomer is reacted to complete the polymerization.

The atmosphere in which the active energy rays are emitted may be ordinary atmosphere or an inert gas. The temperature at which irradiation is effected is normally from ordinary temperature to 100° C. in the first stage and from ordinary temperature to 300° C. in the second stage. The irradiation time is normally from 1 second to 1 minute in the first stage and from 10 seconds to 10 minutes in the second stage.

For the purpose of rapidly completing curing, heat polymerization may be effected at the same time. For example, a method may be used which comprises heating the composition and the entire mold to a temperature of from 30° C. to 300° C. at the same time with irradiation with light. In this case, a heat polymerization initiator may be added to complete polymerization more fairly. However, excessive use of heat polymerization initiator causes increase of birefringence and deterioration of color hue. Specific examples of the heat polymerization initiator include benzoyl peroxide, diisopropyl peroxide carbonate, tert-butylperoxy (2-ethylhexanoate), etc. The amount of the heat polymerization initiator to be used is preferably not greater than 1 part by weight based on 100 parts by weight of the monomer.

In the present invention, radical polymerization by irradiation with light may be followed by heating of the cured product to complete polymerization and to reduce internal strain developed at the time of polymerization. The heating temperature is properly predetermined according to the composition or the glass transition temperature of the cured product but is preferably close to or not higher than the glass transition temperature because excessive heating causes deterioration of color hue of the cured product.

Examples of the process for the preparation of the cured product comprising the photocurable composition of the present invention include a process which comprises subjecting the photocurable composition of the present invention clamped between two ultraviolet-transmitting resin sheets to photocuring, and then peeling the two resin sheets off each other, and a process which comprises injecting the photocurable composition of the present invention into a forming mold having a cavity formed by disposing a spacer between two glass sheets, subjecting the photocurable composition to photocuring, and then releasing the mold from the product.

The cured product thus obtained has a birefringence of normally not greater than 10 nm, preferably not greater than 5 nm, more preferably not greater than 2 nm, particularly not greater than 1 nm.

The cured product has a light transmittance of normally not smaller than 80, preferably not smaller than 85, and thus has an excellent light transmittance. The cured product has YI value of normally not greater than 1, preferably not greater than 0.6, and thus can be said to be little colored yellow.

Further, the cured product of the present invention is excellent in impact resistance and mechanical strength.

The impact resistance is measured in the following manner.

Impact resistance: A plate having a size of 40 mm square and a thickness of 1 mm is used as a sample. Using a falling ball testing machine (produced by TOKYO SEMITSU CO., LTD.), a steel ball having a weight of 4 g is dropped onto the sample from a height of 10 cm. The position at which the steel ball is released is then raised by 5 cm at a time. The falling of the ball is repeated until the sample is destroyed. The falling ball impact strength is determined by [(Falling height at which the sample is destroyed)—5 cm]. In this case, the impact resistance is normally not smaller than 40 cm, preferably not smaller than 60 cm.

Impact resistance is measured also by a method which comprises allowing a steel ball having a weight of 8 g to drop onto a plate having a size of 40 mm square and a thickness of 1 mm as a sample from a height of 10 cm, raising the position at which the steel ball is released by 10 cm at a time, and repeating this procedure until the sample is destroyed. In this case, the falling ball impact strength is determined by [(Falling height at which the sample is destroyed)—10 cm]. In this case, the impact resistance is normally not smaller than 30 cm, preferably not smaller than 50 cm.

The cured product has a flexural modulus of normally from 3,000 to 5,000 MPa, preferably from 3,500 to 4,500 MPa, and thus is flexible. The flexural modulus is measured in the following manner.

Flexural modulus: A plate having a length of 8 cm, a width of 1 cm and a thickness of 1 mm is measured at 25° C. and an intersupport distance of 3 cm using an autograph testing machine (according to JIS K7203).

The cured product has a glass transition temperature of normally not lower than 120° C., preferably not lower than 150° C., and thus has a sufficient heat resistance. The glass transition temperature Tg is measured in the following manner.

Glass transition temperature: A strip-shaped test specimen having a size of 3 mm×30 mm×0.4 mm was measured for glass transition temperature Tg at a load of 2 g by a tensile process TMA (Thermal Mechanical Analysis: thermal mechanical measurement).

The water absorption of the cured product is normally not greater than 0.7%, preferably not greater than 0.5%, which is small enough to have no effects on the product.

If used as a low birefringence optical element, the cured product can be used for display substrate such as liquid crystal display, organic EL display and touch panel, optical filter such as polarizing plate and color filter, optical communications material such as optical fiber and optical wave guide, optical disk substrate, solar cell substrate, lens, prism, etc. Preferred among these applications are display substrate, optical filter, etc.

When used in display substrate, optical filter, etc., the photocurable composition of the present invention is preferably formed into a sheet having a thickness of normally from 0.1 to 3 mm, preferably from 0.2 to 1.5 mm.

(Constitution of Laminated Product)

Examples of the plastic laminated product comprising the cured product of the present invention include a laminated product comprising a gas barrier layer (B) made of a gas barrier material provided on at least one side of a photocurable resin layer (A) made of a cured product obtained by the copolymerization of the photocurable composition of the present invention (laminated product 1), a laminated product comprising a cured layer (C) further provided on at least one side of the laminated product 1 (laminated product 2), and a laminated product comprising an electrically-conducting layer further provided on at least one side of the laminated product 1 or 2.

Figure 2:
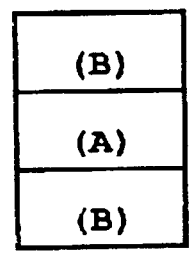
FIG. 2 illustrates an embodiment of the plastic laminated product of the present invention.
Figure 3:
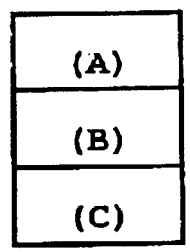
FIG. 3 illustrates an embodiment of the plastic laminated product of the present invention.
Figure 4:
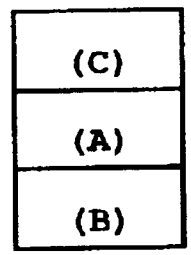
FIG. 4 illustrates an embodiment of the plastic laminated product of the present invention.
Figure 5:
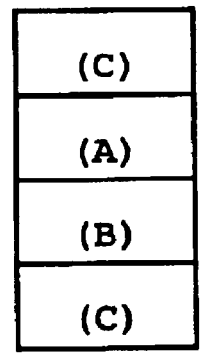
FIG. 5 illustrates an embodiment of the plastic laminated product of the present invention.
Figure 6:
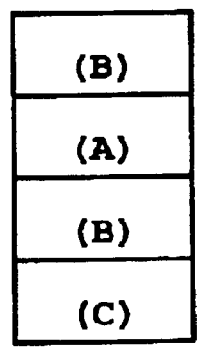
FIG. 6 illustrates an embodiment of the plastic laminated product of the present invention.
Figure 7:
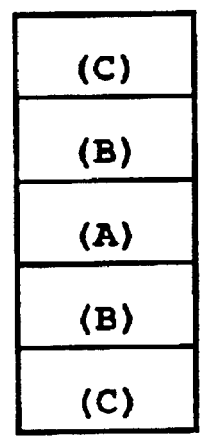
FIG. 7 illustrates an embodiment of the plastic laminated product of the present invention.

A specific embodiment of the laminated product 1 is shown in FIGS. 1 and 2, and a specific embodiment of the laminated product 2 is shown in FIGS. 3 to 7.

The thickness of the photocurable resin (A), e.g., photocurable resin sheet substrate is normally from 0.05 to 3 mm, preferably from 0.1 to 1.5 mm.

(Properties of Laminated Product)

The plastic laminated product made of the cured product of the present invention preferably has a light transmittance of not smaller than 80% at a wavelength of 550 nm. When the light transmittance of the plastic laminated product falls below 80%, the plastic laminated product has a dark picture plane and thus can be difficultly used as a liquid crystal display. The birefringence of the plastic laminated product may be not greater than 20 nm, preferably not greater than 10 nm, more preferably not greater than 5 nm, particularly not greater than 2 nm, even more particularly not greater than 1 nm. When the birefringence of the plastic laminated product is greater than 20 nm, the plastic laminated product, if used in the form of display panel, tends to have uneven colors in the display plane.

Further, the thickness of the plastic laminated product is preferably from 0.05 to 3 mm. When the thickness of the plastic laminated product falls below 0.05 mm, the sheet can easily deflect by gravity, giving a tendency that the conventional process for the preparation of liquid crystal devices cannot be used. On the contrary, when the thickness of the plastic laminated product exceeds 3 mm, the plastic laminated product has the same weight as that of the conventional glass substrate having a thickness of from 0.7 mm to 1.5 mm, which departs from the object of reducing the weight of the plastic laminated product.

Referring to the application of the plastic laminated product, if used as a substrate for liquid crystal display device, a liquid crystal is clamped between two substrates of the plastic laminated product. In other words, a liquid crystal layer is clamped between substrates obtained by providing optionally an insulating layer and an oriented layer on the electrically-conducting layer. A polarizing film is further provided on the outer side of the substrates between which the liquid crystal is clamped. Moreover, an example of structure of electroluminescence display element comprising a light-emitting layer, an insulating layer and a back side electrode formed on the plastic laminated product of the present invention in this order wherein the entire part thereof is coated with a gas barrier material is exemplified. In this case, the light-emitting layer comprises zinc sulfide, cadmium sulfide, zinc selenide or the like, the insulating layer comprises yttrium oxide, thallium oxide, silicon nitride or the like, and the back side electrode comprises aluminum or the like.

<Gas Barrier Layer>

The cured product obtained according to the present invention can comprise a gas barrier layer formed on the surface thereof by various methods so that it can be used as an optical member with gas barrier layer.

As the gas barrier layer there may be used any known material. For example, an inorganic oxide layer or a gas barrier resin layer made of polyvinyl alcohol, ethylene-vinyl alcohol copolymerization, vinylidene chloride or the like may be used. Preferred among these gas barrier layers is inorganic oxide layer. The inorganic oxide is an oxide of metallic, nonmetallic or submetallic material. Specific examples of the inorganic oxide include aluminum oxide, zinc oxide, antimony oxide, indium oxide, calcium oxide, cadmium oxide, silver oxide, gold oxide, chromium oxide, silicon oxide, cobalt oxide, zirconium oxide, tin oxide, titanium oxide, iron oxide, copper oxide, nickel oxide, platinum oxide, palladium oxide, bismuth oxide, magnesium oxide, manganese oxide, molybdenum oxide, vanadium oxide, barium oxide, etc. Particularly preferred among these inorganic oxides is silicon oxide. The inorganic oxide may further comprise a slight amount of metal, non-metallic material or submetallic material or hydroxide thereof incorporated therein. In order to improve the flexibility of the gas barrier layer, the inorganic oxide may further comprise carbon or fluorine incorporated properly therein.

Examples of the method for forming the gas barrier layer include a method involving coating with a resin or the like, and a method involving the formation of a deposited layer of inorganic oxide. As the method involving the formation of a deposited layer there may be used any known method such as vacuum deposition method, vacuum sputtering method, ion plating method and CVD method.

The thickness of the aforementioned gas barrier layer is not specifically limited and varies with the kind of the constituents of the gas barrier layer. For example, if the gas barrier layer is made of silicon oxide, the thickness of the gas barrier layer is preferably from 5 nm to 50 nm taking into account the oxigen gas barrier properties, water vapor gas barrier properties and even the economy. In order to obtain higher oxygen bas barrier properties or water vapor gas barrier properties, the thickness of the gas barrier layer may be raised. However, when the thickness of the gas barrier layer is not smaller than 50 nm, layer stress developed during layer formation can cause cracking of the layer. On the contrary, when the thickness of the gas barrier layer falls below 5 nm, the resulting gas barrier properties are insufficient.

<Cured Layer>

The cured layer is a resin layer for improving the adhesion between the electrically-conducting layer and the cured product when the electrically-conducting layer is laminated on the cured product and protecting the gas barrier layer if provided on the gas barrier layer. The cured layer is obtained by subjecting a photocurable composition comprising an acrylate-based photocurable monomer and an isocyanate group-containing compound, preferably an isocyanate group-containing acrylate compound, to polymerization and curing. The term "comprising" as used in this case is meant to indicate that a polymer or the like which does not inhibit polymerization and curing by irradiation with active energy rays may be used in combination with the acrylate-based photocurable monomer and isocyanate group-containing compound in an amount of not greater than 50 parts by weight based on 100 parts by weight of the total weight of the composition.

Examples of the acrylate-based photocurable monomer include diethylene glycol diacrylate, diethylene glycol dimethacrylate, triethylene glycol diacrylate, triethylene glycol dimethacrylate, polyethylene glycol diacrylate, 1,3- butylene glycol diacrylate, 1,3-butylene glycol dimethacrylate, 1,4-butanediol diacrylate, 1,4-butanediol dimethacrylate, tripropylene glycol diacrylate, tripropylene glycol dimethacrylate, polypropylene glycol diacrylate, 1,6-hexanediol diacrylate, 1,6-hexanediol dimethacrylate, neopentyl glycol diacrylate, neopentyl glycol dimethacrylate, diethylene glycol diacrylate, bis(oxymethyl)tricyclo[5.2.1.0$^{2,6}$]decanediacrylate, bis(oxymethyl)tricyclo[5.2.1.0$^{2,6}$]decanedimethacrylate, bis(oxymethyl)pentacyclo[6.5.1.1$^{3,6}$.0$^{2,7}$.0$^{9,13}$]pentadecane diacrylate, bis(oxymethyl)pentacyclo[6.5.1.1$^{3,6}$.0$^{2,7}$.0$^{9,13}$]pentadecane dimethacrylate, 2,2-bis(4-(acryloxydiethoxy)phenyl)propane, 2,2-bis(4-(methacryloxydiethoxy)phenyl)propane, tricyclo[5.2.1.0$^{2,6}$]decane-3,8-diyl dimethyl diacrylate, tricyclo[5.2.1.0$^{2,6}$]decane-3,8-diyl dimethyl dimethacrylate, trimethylol propane triacrylate, trimethylolpropane trimethacrylate, trimethylolpropane ethoxytriacrylate, trimethylolpropane ethoxytrimethacrylate, tetramethylolmethane triacrylate, tetramethylolmethane triacrylate, tetramethylolmethane tetraacrylate, tetramethylolmethane tetramethacrylate, pentaerythritol triacrylate, pentaertythritol trimethacrylate, pentaerythritol tetraacrylate, pentaerythritol tetramethacrylate, ditrimethylolpropane tetraacrylate, ditrimethylolpropane tetramethacrylate, dipentaerythritol hexaacrylate, dipentaerythritol hexamethacrylate, tris(2-hydroxyethyl) isocyanurate triacrylate, tris(2-hydroxyethyl) isocyanurate trimethacrylate, etc.

Examples of the isocyanate group-containing compound include acryl isocyanurate, methyl isocyanurate, isopropyl isocyanurate, tert-butyl isocyanurate, cyclohexyl isocyanurate, m-isopropenyl-α,α-dimethylbenzyl isocyanurate, octadecyl isocyanate, (meth)acryloyl isocyanate, 2-(meth)acryloyloxyethyl isocyanate, 3-isopropenyl isocyanate, dimethyl(m-isopropenyl)benzyl isocyanate, xylylene diisocyanate, 1,2-diisocyanateethane, 1,3-diisocyanatepropane, 1,2-diisocyanatepropane, 1,4-diisocyanatebutane, 1,5-diisocyanatebutane, 1,5-diisocyanatepentane, 1,6-hexamethylene diisocyanate, bis(3-isocyanatepropyl)ether, bis(3-isocyanatepropyl) sulfide, bis (6-isocyanatehexyl) sulfide, 1,7-diisocyanateheptane, 1,5-diisocyaante-2,2-dimethylpentane, 2,6-diisocyanate-3-methoxyhexane, 1,8-diisocyanateoctane, 1,5-diisocyanate-2,2,4-trimethylpentane, 1,9-diisocyanatenonane, 1,10-diisocyanatedecane, 1,11-diisocyanateundecane, 1,12-diisocyanatedodecane, 1,4-cyclohexanediisocyanate, 4,4'-dicyclohexylmethane diisocyanate, 2,4-dicyclohexylmethane diisocyanate, 3,3'-dicyclohexylmethane diisocyanate, lysine diisocyanate, tolylene diisocyanate, isophorone diisocyanate, 1,5-naphthylene diisocyanate, 4,4'-diphenylmethane diisocyanate, 1,3-bis(α,α-dimethylisocyanatemethyl)benzene, 1,3-bis (isocyanatemethyl)cyclohexane, trimethylhexamethylene diisocyanate, etc.

Examples of the isocyanate group-containing acrylate include compounds obtained by the reaction of a known diisocyanate with a known hydroxy acrylate such as 2-hydroxyethyl acrylate, 2-hydroxypropyl acrylate, 4-hydroxybutyl acrylate, 4-hydroxybutyl diacrylate, 1,4-cyclohexanedimethanol monoacrylate, 2-hydroxy-3-phenoxypropyl acrylate and pentaerythritol triacrylate. Preferred examples of these compounds include adduct of 5-isocyanate-1-(isocyanatemethyl)-1,3,3-trimethylcyclohexane with 2-hydroxyethyl acrylate, 2-(5-isocyanate-1,3,3-trimethylcyclohexylmethylcarbamoyloxy)ethylacrylate, 2-(3-isocyanatemethyl-3,5,5-trimethylcyclohexylcarbamoyloxy)ethylacrylate, 2-(4'-isocyanate-4-diphenylmethanecarbamoyloxy)ethylacrylate, 2-(5-isocyanate-1-carbamoyloxy)ethylacrylate, 4-(5-isocyanate-1,3,3-trimethyl-cyclohexylmethylcarbamoyloxy)butylacrylate, 4-(3-isocyanatemethyl-3,5,5-trimethylcyclohexylcarbamoyloxy)butylacrylate, 4-(4'-isocyanate-4-diphenylmethanecarbamoyloxy)butylacrylate, 4-(5-isocyanate-1-carbamoyloxy)butylacrylate, 2-methacryloyloxyethyl isocyanate, etc.

The photocurable composition constituting the cured layer comprises an isocyanate group-containing compound incorporated therein in an amount of from 1 to 50 parts by weight, preferably from 5 to 30 parts by weight, more preferably from 10 to 20 parts by weight based on from 50 to 99 parts by weight of the acrylate-based photocurable monomer to obtain well-balanced physical properties for cured layer. Even when there is provided no isocyanate group-containing compound, an adhesion between the cured product of the present invention and the cured layer can be obtained. However, the incorporation of the isocyanate group makes it possible to provide a higher adhesion between the gas barrier layer and the transparent electrically-conducting layer. In other words, the reaction of the hydroxyl group on the inorganic layer with the isocyanate group makes it possible to form a firm bond, attaining both the anchoring effect of the electrically-conducting layer and the protecting properties of the gas barrier layer. When the amount of the isocyanate group-containing compound is too small, the adhesion to the gas barrier layer is deteriorated. When the amount of the isocyanate group-containing compound is too large, the chemical resistance is deteriorated.

As polymers to be used in combination with the aforementioned materials there may be exemplified some compounds: polymethyl acrylate, polybutyl acrylate, polyethylene glycol, polyhydroxyethyl acrylate. Further, these active energy ray-curing compositions may further comprise known additives such as oxidation inhibitor, ultraviolet absorber, leveling agent, heat polymerization inhibitor and silane coupling agent incorporated therein. The aforementioned composition is preferably diluted normally with a volatile solvent before being applied. The solvent to be used and the degree of dilution are not specifically limited, but it is required that the solvent be used without impairing the surface conditions of the object to be coated. Further, the solvent to be used should be selected taking into account the stability of the composition, the wettability of the substrate, the volatility, etc. These solvents may be used not only singly but also in the form of mixture of two or more thereof. Examples of the solvent include aromatic hydrocarbons such as toluene and xylene, alcohol, ester, ether, ketone and halogenated hydrocarbon, aprotic polar solvents, etc.

The photocurable composition constituting the cured layer is cured by a known radical polymerization involving the addition of a photopolymerization initiator which generates radicals when irradiated with active energy rays such as ultraviolet rays. Examples of the polymerization initiator to be used herein include benzophenone, benzoyl methyl ether, benzoyl isopropyl ether, diethoxy acetophenone, 1-hydroxycyclohexyl phenyl ketone, 2,6-dimethylbenzoylphenyl phosphine oxide, etc. Preferred examples of the photo-initiator include 1-hydroxycyclohexyl phenyl ketone, bis(2,6-dimethoxybenzoyl)-2,4,4-trimethylpentyl phosphine oxide, and 2,4,6-trimethylbenzoyl phenyl phosphine oxide. These photopolymerization initiators may be used in combination of two or more thereof.

The amount of the photopolymerization initiator to be incorporated in the photocurable composition constituting the cured layer is normally from 1 to 30 parts by weight, preferably from 2 to 20 parts by weight based on 100 parts by weight of the photocurable composition. When the amount of the photo-initiator to be incorporated is too large, the polymerization proceeds suddenly, resulting in the production of a cured product having an increased birefringence or which can be colored. On the contrary, when the amount of the photopolymerization initiator to be added is too small, the composition cannot be thoroughly cured.

In order to form the cured layer, a dip coating method is optimum. In some detail, a method may be employed which comprises dipping the cured product comprising a gas barrier layer provided thereon in the photocurable composition constituting the cured layer, withdrawing the cured product from the photocurable composition, and then irradiating the cured product with active energy rays so that it is cured. During this procedure, the photocurable composition constituting the cured layer may be pre-heated before being cured. In the case where the photocurable composition is diluted with a solvent, the solvent must be removed at the pre-heating step. The thickness of the cured layer is not specifically limited but is normally from 0.1 μm to 50 μm, preferably from 0.3 μm to 10 μm, to maintain a desired adhesion between the cured layer and the cured product or from the standpoint of hardness of the cured layer, etc. The thickness of the cured layer can be controlled by the withdrawing speed during dip coating or by the degree of dilution with solvent.

The dose of active energy rays is arbitrary so far as the photopolymerization initiator can generate radicals. In general, however, ultraviolet rays having a wavelength of from 200 to 400 nm are emitted at a dose of from 0.1 to 100 $J/cm^2$, preferably from 1 to 30 $J/cm^2$. Specific examples of the lamp to be used include metal halide lamp, high pressure mercury lamp, etc.

(Electrically-Conducting Layer)

Various transparent electrically-conducting layers can be formed on the surface of the cured product and laminated product by various methods. Especially the cured product thus obtained can be used as an optical member with transparent electrode. The transparent electrically-conducting layer to be formed on the surface of the cured and laminated product is not specifically limited. Examples of the electrically-conducting material constituting the electrically-conducting layer include indium oxide, tin oxide, gold, silver, copper, nickel, etc. These electrically-conducting materials may be used singly or in admixture of two or more thereof. Among these electrically-conducting materials, indium tin oxide (hereinafter referred to as "ITO") comprising a mixture of from 90% to 99% of indium oxide and from 1% to 10% of tin oxide is normally preferred from the standpoint of balance between transparency and electrical conductivity. The formation of the transparent electrically-conducting layer can be carried out by any of known vacuum deposition method, sputtering method, ion plating method, chemical vapor deposition method, etc. Preferred among these methods is sputtering method from the standpoint of adhesion. The thickness of the transparent electrically-conducting layer is preferably from 500 to 2,000 Å from the standpoint of balance between transparency and electrical conductivity.

The cured product, low birefringence optical member and plastic laminated product obtained according to the present invention has a high heat resistance and a high mechanical strength in combination, not to mention transparency, and thus can be used for many optical purposes such as display substrate (e.g., liquid crystal, organic EL, touch panel), optical disk substrate, solar cell substrate, lens, prism, optical filter, and optical communications material (e.g., optical fiber, optical wave guide).

EXAMPLE

The contents and advantages of the present invention will be further described in the following examples, but the present invention should not be limited to the following examples unless they depart from the essence of the present invention.

The components of the photocurable compositions used in the examples and comparative examples are as set forth in Table 1, and the various properties of the low birefringence plates obtained as cured product are as set forth in Tables 2 to 4. The methods for the measurement of these properties are as follows.

(1) Light transmittance: A test specimen having a thickness of 1 mm was measured for light transmittance at 500 nm.

(2) Birefringence: Birefringence was measured at 25° C. using a birefringence meter (produced by Oak Co., Ltd.).

(3) Heat resistance: A strip-shaped test specimen having a size of 3 mm×30 mm×0.4 mm was measured for heat resistance at a load of 2 g by a tensile process TMA.

(4) Flexural modulus: A plate having a length of 8 cm, a width of 1 cm and a thickness of 1 mm was measured at 25° C. and an intersupport distance of 3 cm using an autograph testing machine (according to JIS K7203).

(5-1) Impact resistance: A plate having a size of 40 mm square and a thickness of 1 mm is used as a sample. Using a falling ball testing machine (produced by TOKYO SEMITSU CO., LTD.), a steel ball having a weight of 8 g is dropped onto the sample from a height of 10 cm to give an impact to the sample. The position at which the steel ball is released is then raised by 10 cm at a time. The falling of the ball is repeated until the sample is destroyed. The falling ball impact strength is determined by [(Falling height at which the sample is destroyed)—10 cm]. (Table 2: Examples 1 to 3, Comparative Examples 1 to 3)

(5-2) Impact resistance: A plate having a size of 40 mm square and a thickness of 1 mm is used as a sample. Using a falling ball testing machine (produced by TOKYO SEMITSU CO., LTD.), a steel ball having a weight of 4 g is dropped onto the sample from a height of 10 cm to give an impact to the sample. The position at which the steel ball is released is then raised by 5 cm at a time. The falling of the ball is repeated until the sample is destroyed. The falling ball impact strength is determined by [(Falling height at which the sample is destroyed)—5 cm]. (Table 3: Examples 4 to 9, and Table 4: Examples 10 to 14)

(6) Releasability: Cured products which were found to have cracks when released from the mold were considered unacceptable (x).

(7) Surface resistivity of electrically-conducting layer: Using a four-terminal process resistance meter (Lorestor MP) produced by Mitsubishi Chemical Corporation, the electrically-conducting layer was measured for surface resistivity.

(8) Measurement of gas barrier properties: Using an oxygen mocon meter produced by Oxytran Co., Ltd., oxygen permeability was measured at a temperature of 23° C. and a humidity of 80%. The acceptable oxygen permeability is not greater than 2 cc/m$^2$·24 hour·atm, preferably not greater than 1 cc/m$^2$·24 hour·atm, more preferably not greater than 0.7 cc/m$^2$·24 hour·atm, even more preferably 0.5 cc/m$^2$·24 hour·atm, particularly not greater than 0.2 cc/m$^2$·24 hour·atm. When the oxygen permeability exceeds the above defined range, it is much likely that the product can show display defectives when used as a liquid crystal panel.

(9) Color hue (yellowness index): YI value before and after UV irradiation test: A sample having a thickness of 0.5 mm was irradiated with ultraviolet rays from a 40 W/cm output metal halide lamp disposed above and under the sample at a distance of 40 cm for 30 minutes. The color hue of the sample was measured by a color difference meter (SM color computer Type SM-5, produced by SUGA TEST INSTRUMENTS CO., LTD.) to determine transmission YI (according to JIS K7103).

Example 1

(Preparation of (Meth)Acrylate)

Into a 1 l four-necked flask equipped with an agitator, a thermometer, a condenser and a water separator were charged 150 parts by weight of bis(hydroxymethyl)tricyclo[5.2.1.0$^{2,6}$]decane, 160 parts by weight of methacrylic acid, 0.25 part by weight of hydroquinone monomethyl ether, 0.07 part by weight of copper powder, 2.7 parts by weight of p-toluenesulfonic acid and 200 parts by weight of n-heptane. These components were then reacted at a temperature of from 90° C. to 130° C. with air being flown into the system at a rate of 4 cc per minute while the resulting water was being withdrawn therefrom. The reaction was traced by a high-performance liquid chromatography. Thus, the reaction was then suspended when the weight ratio of bis(oxymethyl)tricyclo[5.2.1.0$^{2,6}$]decane=dimethacrylate to bis(hydroxymethyl)tricyclo[5.2.1.0$^{2,6}$]decane=monomethacrylate reached 94:6.

After the termination of the reaction, the resulting crude product solution was washed with a 5% aqueous solution of sodium hydroxide and then with water until it became neutral. Thereafter, to the solution were added 0.05 parts by weight of hydroquinone monemethyl ether. n-Heptane was then distilled off at a temperature of 60° C. and a pressure of 5 Torr for 30 minutes to obtain 240 parts by weight of a reaction product. The results of analysis by high-performance liquid chromatography showed that the weight ratio of bis(oxymethyl)tricyclo[5.2.1.0$^{2,6}$]decane=dimethacrylate to bis (hydroxymethyl)tricyclo[5.2.1.0$^{2,6}$]decane=monomethacrylate was 94:6.

<Preparation of Cured Product>

The acrylate composition comprising 94 parts of bis(hydroxymethyl)tricyclo[5.2.1.0$^{2,6}$]decane=dimethacrylate and 6 parts of bis(hydroxymethyl)tricyclo[5.2.1.0$^{2,6}$]decane=monomethacrylate thus prepared was then mixed with 6 parts of pentaerythritol tetrakis(β-thiopropionate), 0.05 part of 2,4,6-trimethylbenzoyl diphenyl phosphine oxide ("Lucirin TPO", produced by BASF JAPAN CO., LTD.) and 0.05 part of benzophenone with uniform stirring. The mixture was then defoamed to obtain a composition. The composition was then injected into a optically polished glass mold comprising a silicon plate having a thickness of 0.4 mm as a spacer. The composition was then irradiated with ultraviolet rays from a 80 W/cm output metal halide lamp disposed above and under the glass plate at a distance of 40 cm for 5 minutes. The composition which had thus been irradiated with ultraviolet rays was released from the mold, and then heated to a temperature of 160° C. for 1 hour to obtain a cured product having a thickness of 0.4 mm. The various properties of the cured product were as set forth in Table 2.

Example 2

The procedure of Example 1 was followed except that the reaction was suspended when the weight ratio of bis(oxymethyl)tricyclo[5.2.1.0$^{2,6}$]decane=dimethacrylate to bis(hydroxymethyl)tricyclo[5.2.1.0$^{2,6}$]decane=monomethacrylate reached 92:8. Thus, a 92:8 (by weight) mixture of bis(oxymethyl)tricyclo[5.2.1.0$^{2,6}$]decane=dimethacrylate and bis(hydroxymethyl)tricyclo[5.2.1.0$^{2,6}$]decane=monomethacrylate was obtained.

A cured product was then obtained in the same manner as in Example 1 except that an acrylate composition comprising 92 parts of bis(hydroxymethyl)tricyclo[5.2.1.0$^{2,6}$]decane=dimethacrylate and 8 parts of bis(hydroxymethyl)tricyclo[5.2.1.0$^{2,6}$]decane=monomethacrylate was used. The various properties of the cured product were as set forth in Table 2.

Example 3

The procedure of Example 1 was followed except that the reaction was suspended when the weight ratio of bis(oxymethyl)tricyclo[5.2.1.0$^{2,6}$]decane=dimethacrylate to bis(hydroxymethyl)tricyclo[5.2.1.0$^{2,6}$]decane=monomethacrylate reached 96:4. Thus, a 96:4 (by weight) mixture of bis(oxymethyl)tricyclo[5.2.1.0$^{2,6}$]decane=dimethacrylate and bis(hydroxymethyl)tricyclo[5.2.1.0$^{2,6}$]decane=monomethacrylate was obtained.

A cured product was then obtained in the same manner as in Example 1 except that an acrylate composition comprising 96 parts of bis(hydroxymethyl)tricyclo[5.2.1.0$^{2,6}$]decane=dimethacrylate and 4 parts of bis(hydroxymethyl)tricyclo[2.2.1.0$^{2,6}$]decane=monomethacrylate was used. The various properties of the cured product were as set forth in Table 2.

Comparative Example 1

The procedure of Example 1 was followed except that the reaction was suspended when the weight ratio of bis(oxymethyl)tricyclo[5.2.1.0$^{2,6}$]decane=dimethacrylate to bis(hydroxymethyl)tricyclo[5.2.1.0$^{2,6}$]decane=monomethacrylate reached 99.5:0.5. Thus, a 99.5:0.5 (by weight) mixture of bis(oxymethyl)tricyclo[5.2.1.0$^{2,6}$]decane=dimethacrylate and bis(hydroxymethyl)tricyclo[5.2.1.0$^{2,6}$]decane=monomethacrylate was obtained.

A cured product was then obtained in the same manner as in Example 1 except that an acrylate composition comprising 99.5 parts of bis(hydroxymethyl)tricyclo[5.2.1.0$^{2,6}$]decane=dimethacrylate and 0.5 part of bis(hydroxymethyl)tricyclo[5.2.1.0$^{2,6}$]decane=monomethacrylate was used. The various properties of the cured product were as set forth in Table 2.

Comparative Example 2

The procedure of Example 1 was followed except that the reaction was suspended when the weight ratio of bis(oxymethyl)tricyclo[5.2.1.0$^{2,6}$]decane=dimethacrylate to bis(hydroxymethyl)tricyclo[5.2.1.0$^{2,6}$]decane=monomethacrylate reached 60:40. Thus, a 60:40 (by weight) mixture of bis(oxymethyl)tricyclo[5.2.1.0$^{2,6}$]decane=dimethacrylate and bis(hydroxymethyl)tricyclo[5.2.1.0$^{2,6}$]decane=monomethacrylate was obtained.

A cured product was then obtained in the same manner as in Example 1 except that an acrylate composition comprising 60 parts of bis(hydroxymethyl)tricyclo[5.2.1.0$^{2,6}$]decane=dimethacrylate and 40 parts of bis(hydroxymethyl)tricyclo[5.2.1.0$^{2,6}$]decane=monomethacrylate was used. The various properties of the cured product were as set forth in Table 2.

Comparative Example 3

The procedure of Example 1 was followed except that the 94:6 (by weight) mixture of bis(oxymethyl)tricyclo[5.2.1.0$^{2,6}$]decane=dimethacrylate and bis(hydroxymethyl)tricyclo[5.2.1.0$^{2,6}$]decane=monomethacrylate as obtained in Example 1 was used but pentaerythritol tetrakis(β-thiopropionate) was not used to obtain a cured product. The various properties of the cured product were as set forth in Table 2.

Reference Example 1
(Preparation of Plastic Laminated Product)

SiO$_2$ was deposited on the 0.4 mm thick cured product obtained in Example 1 to a thickness of 200 Å using a sputtering device (Type CFS-4ES, produced by Tokuda Seisakusyo Co. Ltd.). The oxygen permeability of the plastic laminated product thus obtained was 0.5 cc/m$^2$·24 h·atm.

(Formation of Electrically-Conducting Layer)

ITO was deposited on the SiO$_2$ side of the plastic laminated product thus obtained to a thickness of 1,500 Å using a sputtering device (Type CFS-4ES, produced by Tokuda Seisakusyo Co. Ltd.). The surface resistivity of the electrically-conducting sheet thus obtained was 30 Ω/□.

TABLE 1

Components of photocurable composition

|  | Bis (meth) acrylate | Mono (meth) acrylate | Mercaptan compound |
|---|---|---|---|
| Example 1 | (A) 94 | (B) 6 | (C) 6 |
| Example 2 | (A) 92 | (B) 8 | (C) 6 |
| Example 3 | (A) 96 | (B) 4 | (C) 6 |
| Comparative Example 1 | (A) 99.5 | (B) 0.5 | (C) 6 |
| Comparative Example 2 | (A) 60 | (B) 40 | (C) 6 |
| Comparative Example 3 | (A) 94 | (B) 6 | None |

(A) Bis (hydroxymethyl) tricyclo [5.2.1.0$^{2,6}$] decane = dimethacrylate
(B) Bis (hydroxymethyl) tricyclo [5.2.1.0$^{2,6}$] decane = monomethacrylate
(C) Pentaerythritoltetrakis (β-thiopropionate)

TABLE 2

Properties of cured product

| | Light transmittance (%) | birefringence (nm) | Heat resistance Tg (° C.) | Impact resistance (cm) | Flexural modulus (MPa) | Water absorption (%) | Releasability |
|---|---|---|---|---|---|---|---|
| Example 1 | 92 | 0.4 | 190 | 100 | 4,000 | 0.5 | Good |
| Example 2 | 92 | 0.4 | 190 | 110 | 4,100 | 0.5 | Good |
| Example 3 | 92 | 0.4 | 190 | 90 | 3,900 | 0.5 | Good |
| Comparative Example 1 | 92 | 1.0 | 190 | 60 | 3,700 | 0.5 | Fair |
| Comparative Example 2 | 92 | 0.4 | 130 | 100 | 3,000 | 1.0 | Good |
| Comparative Example 3 | 91 | 5.0 | 250 | 40 | 3,400 | 0.3 | Poor |

(Preparation of Cured Product)

Example 4

An acrylate composition comprising 94 parts by weight of bis (hydroxymethyl)tricyclo[5.2.1.0$^{2,6}$]decane=dimethacrylate and 6 parts by weight of bis(hydroxymethyl)tricyclo[5.2.1.0$^{2,6}$]decane=monomethacrylate was mixed with 6 parts by weight of pentaerythritol tetrakis(β-thiopropionate) and 0.1 parts by weight of 2-hydroxy-4-methoxybenzophenone. To the mixture were then added 0.1 parts by weight of 2,4,6-trimethylbenzoyl diphenyl phosphine oxide ("Lucirin TPO", produced by BASF JAPAN Co., LTD.) and 0.1 parts of benzophenone as a photoinitiator. The mixture was uniformly stirred, and then defoamed to obtain a photocurable composition.

The photocurable composition was then injected into an optically polished glass mold comprising a silicone plate having a thickness of 0.5 mm as a spacer and an optically polished glass mold comprising a silicone plate having a thickness of 1 mm as a spacer. The photocurable composition was then irradiated with ultraviolet rays from a 80 W/cm output metal halide lamp disposed above and under the photocurable composition at a distance of 40 cm from the glass plate for 5 minutes. The photocurable composition which had thus been irradiated with ultraviolet rays was released from the mold, and then heated to a temperature of 160° C. for 1 hour to obtain a cured product. The various properties of the cured product were as set forth in Table 3.

Example 5

A cured product was obtained in the same manner as in Example 4 except that 2-hydroxy-4-n-octoxybenzophenone was used instead of 2-hydroxy-4-methoxybenzophenone. The various properties of the cured product were as set forth in Table 3.

Example 6

A cured product was obtained in the same manner as in Example 4 except that 2-hydroxy-4-methoxy-2'-carboxybenzophenone was used instead of 2-hydroxy-4-methoxybenzophenone. The various properties of the cured product were as set forth in Table 3.

Example 7

A cured product was obtained in the same manner as in Example 4 except that 2-hydroxy-4-methoxybenzophenone was not used. The various properties of the cured product were as set forth in Table 3.

Example 8

A cured product was obtained in the same manner as in Example 4 except that ethyl(β,β-diphenyl)cyanoacrylate was used instead of 2-hydroxy-4-methoxybenzophenone. The various properties of the cured product were as set forth in Table 3.

Example 9

A cured product was obtained in the same manner as in Example 4 except that phenyl-4-piperidinylcarbonate was used instead of 2-hydroxy-4-methoxybenzophenone. The various properties of the cured product were as set forth in Table 3.

(Preparation of Plastic Laminated Product)

Reference Example 2

(Formation of Gas Barrier Layer)

$SiO_x$ was deposited on the 0.4 mm thick cured product obtained in Example 4 to a thickness of 200 Å using a sputtering device (Type CFS-4ES, produced by Tokuda Seisakusyo Co. Ltd.). The oxygen permeability of the plastic laminated product with gas barrier layer thus obtained was 0.5 cc/m²·24 h·atm.

(Formation of Electrically-Conducting Layer)

ITO was deposited on the $SiO_x$ side of the plastic laminated product with gas barrier layer thus obtained to a thickness of 1,500 Å using a sputtering device (Type CFS-4ES, produced by Tokuda Seisakusyo Co. Ltd.). The surface resistivity of the electrically-conducting sheet thus obtained was 30 Ω/□.

released from the mold, and then heated to a temperature of 160° C. for 1 hour to obtain a cured product. The various properties of the cured product were as set forth in Table 4.

Example 11

A cured product was obtained in the same manner as in Example 10 except that 1,6-hexanediol bis[3-(3,5-di-tert-butyl-4-hydroxyphenyl)propionate] was used instead of tetrakis[methylene-3-(3',5'-di-tert-butyl-4-hydroxyphenyl)propionate]. The various properties of the cured product were as set forth in Table 4.

Example 12

A cured product was obtained in the same manner as in Example 10 except that 2,2-thiodiethylene bis[3-(3,5-di-tert-butyl-4-hydroxyphenyl)propionate] was used instead of tetrakis[methylene-3-(3',5'-di-tert-butyl-4-hydroxyphenyl)propionate]. The various properties of the cured product were as set forth in Table 4.

Example 13

A cured product was obtained in the same manner as in Example 10 except that 2,4-dimethyl-6-tert-butylphenol was

TABLE 3

| | Properties of cured product | | | | | | | | |
|---|---|---|---|---|---|---|---|---|---|
| | Light transmittance | Bire-fringence | Heat resistance Tg | Impact resistance | Flexural modulus | Water absorption | Releas-ability | Color hue (YI value) at UV irradiation test | |
| | (%) | (nm) | (° C.) | (cm) | (MPa) | (%) | | Before test | After test |
| Example 4 | 91 | 0.6 | 190 | 75 | 4,100 | 0.5 | Good | 1.46 | 1.78 |
| Example 5 | 91 | 0.6 | 190 | 65 | 3,900 | 0.5 | Good | 1.49 | 1.86 |
| Example 6 | 92 | 0.5 | 190 | 65 | 3,800 | 0.5 | Good | 1.39 | 1.95 |
| Example 7 | 91 | 0.6 | 190 | 70 | 4,000 | 0.5 | Good | 1.55 | 4.15 |
| Example 8 | 92 | 0.7 | 190 | 65 | 3,900 | 0.5 | Good | 1.63 | 3.73 |
| Example 9 | 91 | 5.5 | 190 | 70 | 4,100 | 0.5 | Good | 1.56 | 3.59 |

(Preparation of Cured Product)

Example 10

An acrylate composition comprising 94 parts by weight of bis(hydroxymethyl)tricyclo[5.2.1.0$^{2,6}$]decane=dimethacrylate and 6 parts by weight of bis(hydroxymethyl)tricyclo[5.2.1.0$^{2,6}$]decane=monomethacrylate was mixed with 6 parts by weight of pentaerythritol tetrakis(β-thiopropionate) and 0.3 part by weight of tetrakis[methylene-3-(3',5'-di-tert-butyl-4-hydroxyphenyl)propionate]. To the mixture were then added 0.1 part by weight of 2,4,6-trimethylbenzoyl diphenyl phosphine oxide ("Lucirin TPO", produced by BASF JAPAN CO., LTD.) and 0.1 part of benzophenone as a photo-initiator. The mixture was uniformly stirred, and then defoamed to obtain a photocurable composition.

The photocurable composition was then injected into an optically polished glass mold comprising a silicone plate having a thickness of 0.5 mm as a spacer and an optically polished glass mold comprising a silicone plate having a thickness of 1 mm as a spacer. The photocurable composition was then irradiated with ultraviolet rays from a 80 W/cm output metal halide lamp disposed above and under the photocurable composition at a distance of 40 cm from the glass plate for 5 minutes. The photocurable composition which had thus been irradiated with ultraviolet rays was used instead of tetrakis[methylene-3-(3',5'-di-tert-butyl-4-hydroxy-phenyl)propionate]. The various properties of the cured product were as set forth in Table 4.

Example 14

A cured product was obtained in the same manner as in Example 10 except that 2,2'-methylene-bis (4-ethyl-6-tert-butylphenol) was used instead of tetrakis[methylene-3-(3',5'-di-tert-butyl-4-hydroxyphenyl)propionate]. The various properties of the cured product were as set forth in Table 4.

(Preparation of Plastic Laminated Product)

Reference Example 3

(Formation of Gas Barrier Layer)

$SiO_x$ was deposited on the 0.4 mm thick cured product obtained in Example 10 to a thickness of 200 Å using a sputtering device (Type CFS-4ES, produced by Tokuda Seisakusyo Co. Ltd.). The oxygen permeability of the plastic laminated product with gas barrier layer thus obtained was 0.5 cc/m²·24 h·atm.

(Formation of Electrically-Conducting Layer)

ITO was deposited on the $SiO_x$ side of the plastic laminated product with gas barrier layer thus obtained to a thickness of 1,500 Å using a sputtering device (Type CFS-4ES, produced by Tokuda Seisakusyo Co. Ltd.). The surface resistivity of the electrically-conducting sheet thus obtained was 30 Ω/□.

TABLE 4

| | Properties of cured product | | | | | | | | |
|---|---|---|---|---|---|---|---|---|---|
| | Light transmittance (%) | Birefringence (nm) | Heat resistance Tg (°C.) | Impact resistance (cm) | Flexural modulus (MPa) | Water absorption (%) | Releasability | Color hue (YI value) at heating | |
| | | | | | | | | Before test | After test |
| Example 10 | 92 | 0.6 | 190 | 70 | 4,000 | 0.5 | Good | 0.76 | 1.74 |
| Example 11 | 91 | 0.5 | 190 | 70 | 3,900 | 0.5 | Good | 0.89 | 1.96 |
| Example 12 | 92 | 0.5 | 190 | 65 | 4,000 | 0.5 | Good | 0.95 | 1.99 |
| Example 13 | 92 | 0.6 | 190 | 70 | 4,000 | 0.5 | Good | 1.32 | 3.03 |
| Example 14 | 91 | 5.5 | 190 | 65 | 4,100 | 0.5 | Good | 1.29 | 2.95 |

INDUSTRIAL APPLICABILITY

In accordance with the present invention, a photocurable composition which, when photo-cured, provides a cured product that has an improved mechanical strength while maintaining its inherent properties such as low birefringence and heat resistance, a cured product comprising the same and a process for producing the same can be provided.

What is claimed is:

1. A photocurable composition comprising the following components A, B and C with the proviso that the proportion of the various components each are represented relative to 100 parts by weight of the sum of the weight of the components A and B:

Component A: 70 to 99 parts by weight of an alicyclic skeleton-containing bis(meth)acrylate represented by the formula (I):

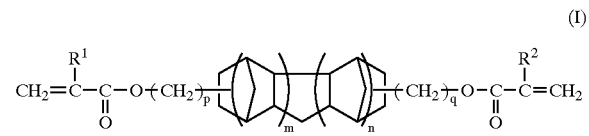

(I)

wherein $R^1$ and $R^2$ each independently represent a hydrogen atom or methyl group; m represents 1 or 2; n represents 0 or 1; and p and q each independently represent 0, 1 or 2;

Component B: 1 to 30 parts by weight of an alicyclic skeleton-containing mono(meth)acrylate represented by the formula (II):

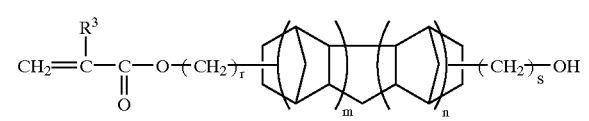

(II)

wherein $R^3$ represents a hydrogen atom or methyl group; m represents 1 or 2; n represents 0 or 1; and r and s each independently represent 0, 1 or 2; and Component C: 1 to 10 parts by weight of a mercapto compound having a functionality of at least two.

2. The photocurable composition as claimed in claim 1, wherein the mercapto compound having a functionality of at least two is at least one mercapto compound selected from compounds represented by the formulae (III), (IV) and (V):

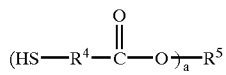

(III)

wherein $R^4$ represents a methylene group or ethylene group; $R^5$ represents a $C_2$–$C_{15}$ hydrocarbon residue which may contain an ether oxygen; and a represents an integer of from 2 to 6;

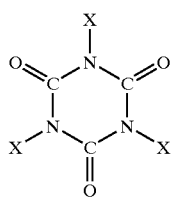

(IV)

wherein X represents HS—$(CH_2)_b$—CO—$(OCH_2CH_2)_d$—$(CH_2)_c$—, with the proviso that b and a each independently represent an integer of from 1 to 8; and d represents 0, 1 or 2; and

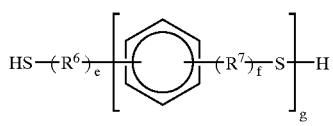

(V)

wherein $R^6$ and $R^7$ each independently represent an alkylene group; e and f each independently represent 0 or 1; and g represents 1 or 2.

3. The photocurable composition as claimed in claim 1, which further comprises the following component D:

Component D: Phenol compound represented by the formula (VI) or (VII):

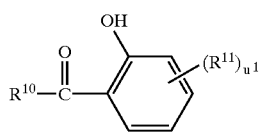

(VI)

wherein $R^{10}$ represents an OH group, a phenyl(oxy) group which may be substituted by a $C_1$–$C_4$ alkyl group or $C_1$–$C_4$ alkoxy group; $R^{11}$ represents a group selected from the group consisting of an OH group, $C_1$–$C_4$ alkoxy group, SO$_3$H group and SO$_3$Na group, with the proviso that when there are a plurality of R$^{11}$'s the plurality of R$^{11}$'s may be the same or different; and u$^1$ represents an integer of from 0 to 2;

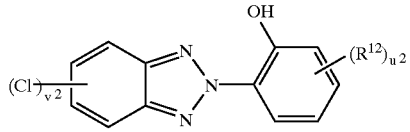

(VII)

wherein R$^{12}$ represents a group selected from the group consisting of C$_1$–C$_{12}$ alkyl group and C$_1$–C$_8$ alkoxy group, with the proviso that when there are a plurality of R$^{12}$'s, the plurality of R$^{12}$'s maybe the same or different; u$^2$ represents an integer of from 0 to 2; and v$^2$ represents an integer of 0 or 1.

4. The photocurable composition as claimed in claim 3, wherein the phenol compound as component D is a phenol compound represented by the formula (VIII):

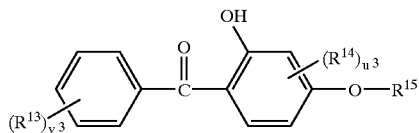

(VIII)

wherein R$^{13}$ represents a group selected from the group consisting of OH group and C$_1$–C$_4$ alkoxy group, with the proviso that when there are a plurality of R$^{13}$'s the plurality of R$^{13}$'s may be the same or different; R$^{14}$ represents an SO$_3$H group or SO$_3$Na group; R$^{15}$ represents a hydrogen atom, C$_1$–C$_4$ alkyl group or benzyl group; u$^3$ represents a number of 0 or 1; and v$^3$ represents an integer of from 0 to 2.

5. The photocurable composition as claimed in claim 3, wherein the amount of the phenol compound as component D is from 0.02 to 0.1 part by weight based on 100 parts by weight of the sum of the weight of the components A and B.

6. The photocurable composition as claimed in claim 1, which further comprises the following component E:

Component E: compound containing 3,5-di-tert-butyl-4-hydroxyphenyl group.

7. The photocurable composition as claimed in claim 6, wherein the compound containing 3,5-di-tert-butyl-4-hydroxyphenyl group as component E is a compound having two or more 3,5-di-tert-butyl-4-hydxoxyphenyl groups.

8. The photocurable composition as claimed in claim 7, wherein the compound containing 3,5-di-tert-butyl-4-hydroxyphenyl group as component E is a compound represented by the formula (IX) or (X):

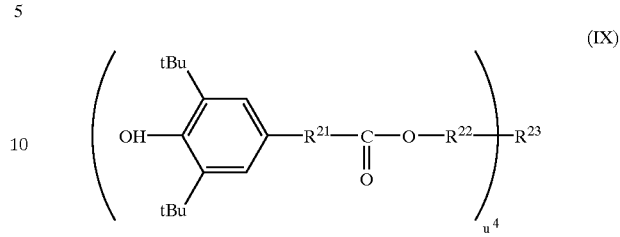

(IX)

wherein R$^{21}$ and R$^{22}$ each represent an alkylene group; R$^{23}$ represents a C$_1$–C$_2$ alkyl group or sulfur atom; u$^4$ represents an integer of 2 or more with the proviso that when R$^{23}$ is a sulfur atom, u$^4$ represents 2; and tBu represents tert-butyl group;

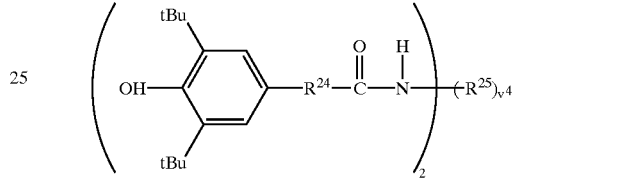

(X)

9. The photocurable composition as claimed in claim 6, wherein the amount of the compound containing 3,5-di-tert-butyl-4-hydroxyphenyl group as component E is from 0.05 to 1 part by weight based on 100 parts by weight of the sum of the weight of the components A and B.

10. A cured product obtained by the copolymerization of a photocurable composition as claimed in claim 1 in the presence of a radical polymerization initiator.

11. The cured product as claimed an claim 10, which is a low birefringence optical member.

12. A liquid crystal display device comprising a low birefringence optical member as claimed in claim 11.

13. A process for the preparation of a cured product which comprises the copolymerization of a photocurable composition as claimed in claim 1 in the presence of a radical polymerization initiator.

* * * * *